(12) United States Patent
Heilman

(10) Patent No.: US 11,876,353 B2
(45) Date of Patent: Jan. 16, 2024

(54) METHODS, SYSTEMS, AND APPARATUSES FOR TRANSFERRING POWER AND ANALYSIS

(71) Applicant: CONSTELLATION ENERGY GENERATION, LLC, Kennett Square, PA (US)

(72) Inventor: David D. Heilman, Geneseo, IL (US)

(73) Assignee: Constellation Energy Generation, LLC, Kennett Square, PA (US)

(*) Notice: Subject to any disclaimer, the term of this patent is extended or adjusted under 35 U.S.C. 154(b) by 0 days.

(21) Appl. No.: 15/931,332

(22) Filed: May 13, 2020

(65) Prior Publication Data
US 2021/0359496 A1    Nov. 18, 2021

(51) Int. Cl.
| | |
|---|---|
| H02B 1/015 | (2006.01) |
| G01R 1/04 | (2006.01) |
| H02B 1/18 | (2006.01) |
| H02J 4/00 | (2006.01) |
| H01H 85/20 | (2006.01) |

(52) U.S. Cl.
CPC .......... *H02B 1/015* (2013.01); *G01R 1/0416* (2013.01); *H02B 1/18* (2013.01); *H02J 4/00* (2013.01); *H01H 85/203* (2013.01); *H01H 85/2015* (2013.01)

(58) Field of Classification Search
CPC .. H02B 1/015; H02B 1/18; H02J 4/00; H01H 85/20; H01H 85/2015; H01H 85/203; H01H 85/204; H01H 2085/206; G01R 1/0416
See application file for complete search history.

(56) References Cited

U.S. PATENT DOCUMENTS 2,941,059 A * 6/1960 Sims .................... H01H 85/201
                                                          337/187
4,884,050 A * 11/1989 Kozel ................ H01H 85/0417
                                                          337/264

FOREIGN PATENT DOCUMENTS

| KR | 20047098 Y1 | 1/2015 |
| KR | 200476098 Y1 * | 1/2015 |

OTHER PUBLICATIONS

English translation of Kim (KR 20-0476098 Y1) dated Jan. 30, 2015, translated on Sep. 2021. (Year: 2021).*
International Search Report and Written Opinion issued in related application No. PCT/US2021/032286 dated Jun. 24, 2021.

* cited by examiner

*Primary Examiner* — Robert J Hoffberg
(74) *Attorney, Agent, or Firm* — Ballard Spahr LLP

(57) ABSTRACT

Methods, systems, and apparatuses are described for transferring power. A power transfer device may be configured to securely fit in a fuse block, fuse holder, and/or the like. The power transfer device may transfer power from a source to a load connected to the fuse block, fuse holder, and/or the like, while also isolating the power to prevent the power from backfeeding to the source. The power transfer device may be used to perform testing, measurements, and/or analysis (e.g., voltage measurements, power measurements, frequency analysis, system impedance testing, etc.).

20 Claims, 16 Drawing Sheets

METHODS, SYSTEMS, AND APPARATUSES FOR TRANSFERRING POWER AND ANALYSIS

BACKGROUND

Generally, electrical power is needed to control most functions within a commercial industrial plant/facility. Further, these plants and facilities have critical safety functions that must be maintained in the event of a loss of electrical power to avoid safety degradation or damage. For example, during postulated accident scenarios nuclear power plants need certain systems to continuously maintain power to safely shut the plant down and avoid the potential for core damage. As another example, industrial chemical plants need to maintain control of critical chemical process to avoid explosions and/or chemical spills. Thus, many commercial industrial plants/facilities require backup generators that provide emergency power to large portions of plant/facility equipment in case of a loss of normal electrical supply power. However, for many of these plants/facilities', emergency backup power is needed for various critical smaller electrical loads that operate at a range of AC and DC voltages and currents to control, operate, and monitor the most important critical equipment to facilitate safe shutdown and avoid large scale accident and damage. During these loss of power events time is of the essence and it is imperative to restore power to these critical smaller electrical loads as quickly and simply as possible to mitigate the event and minimize any damage caused by loss of power.

For example, during extreme accident scenarios and natural disaster events nuclear power plants have specific time requirements that electrical power must be returned to critical equipment (e.g., equipment that provides critical cooling functions to prevent damage or escalating the event). During extreme accident scenarios if the critical equipment loses offsite grid power and the installed backup generators also fail, a nuclear power plant may have a very short time frame, as in a matter of hours, before severe damage to the facility occurs. This scenario was exemplified in the 2011 Fukushima-Diachi earthquake and resultant nuclear accident. Therefore, there is a critical need to ensure that nuclear power plants do not go without main or backup emergency power to their critical safety equipment for a certain number of hours.

While nuclear power plants are designed with emergency backup power systems utilizing one or more large installed generators, the installations are complex and difficult to maintain, have limited fuel supply for prolonged events, and the installed large backup generator installations may be impacted in a natural disaster or hampered by an extended loss of electrical grid event. To address this concern, the US Nuclear Industry and U.S. Nuclear Regulatory Commission implemented a Diverse and Flexible Mitigation Capability ("FLEX") strategy to ensure that nuclear power plants receive power beyond their main and installed emergency power systems in a case of an extended loss of power event. Generally, the FLEX strategy provides for a third form of emergency power through large portable machinery and power generators that nuclear power plants can utilize in case of an extended loss of power. Additional FLEX equipment is dispersed throughout the United States in strategic locations to service as many nuclear power plants as possible, while at the same time ensuring that a natural disaster does not damage more than one FLEX storage location. However, the FLEX strategy is extremely expensive to maintain, somewhat complex to implement during an extreme event, and could experience a significant delay in mobilizing FLEX equipment to provide power to the nuclear facilities during a very large-scale natural disaster event or terrorist type event affecting regional or national power grids. Furthermore, the FLEX equipment is designed to provide power to the entire nuclear power plant (e.g., just like a large backup generator), and not just target critical pieces of equipment that need power to maintain the safety of the nuclear power plant. For example, a nuclear power plant may only need to provide power to three (3) pieces of equipment and/or components to maintain the safety of the core, while the rest of the nuclear power plant can safely remain without power.

There is a long felt need in the nuclear power industry to be able to provide emergency power response in a much more quick and efficient manner to the most critical pieces of equipment. A portable power device needed to restore power to critical smaller electrical loads (both AC and DC power), regardless of status of industrial plant's/facility's main or installed backup up power source or distribution system, must be able to safely and securely attach to power distribution systems. Poorly connected portable power device may cause arcing, an inconsistent transfer of power, reduced power transferal, and/or the like. Power provided to a power distribution system must be isolated and/or prevented from backfeeding to the portable power device.

SUMMARY

It is to be understood that both the following general description and the following detailed description are exemplary and explanatory only and are not restrictive. Provided are methods, systems, and apparatuses for protecting various critical instrumentation and control circuits, as well as power circuits, when a primary power source fails (e.g., a primary power source is disrupted, etc.) by generating power, transferring power, and/or enabling measurements and/or analysis of the various critical instrumentation and control circuits, power circuits, and/or the like.

Various systems for generating and providing power are described. Each system for generating and providing power described herein may provide power to a load (e.g., critical pieces of equipment, etc.) via an apparatus configured to securely attach to a power distribution component associated with the load, such as a fuse block. For example, components of the apparatus may be configured (e.g., machined, etc.) with dimensions that complement/correspond to a fuse block and enable the apparatus to securely fit and/or attach to opposing conductive contacts (e.g., fuse contacts, etc.) of the fuse block. In some instances, the apparatus may be used for testing, measurements, and/or analysis. For example, the apparatus may securely fit and/or attach to opposing conductive contacts (e.g., fuse contacts, etc.) of a fuse block and/or related components and isolate electrical conduction through either of the opposing conductive contacts. A testing, measurements, and/or analysis device/component may attach to the apparatus and perform testing, measurements, and/or analysis (e.g., voltage measurements, power measurements, frequency analysis, system impedance testing, etc.) on any component, device and/or the like attached to the non-isolated conductive contact.

Additional advantages will be set forth in part in the description which follows or can be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, show examples and together with the description, serve to explain the principles of the methods and systems.

DETAILED DESCRIPTION

Figure 1A:
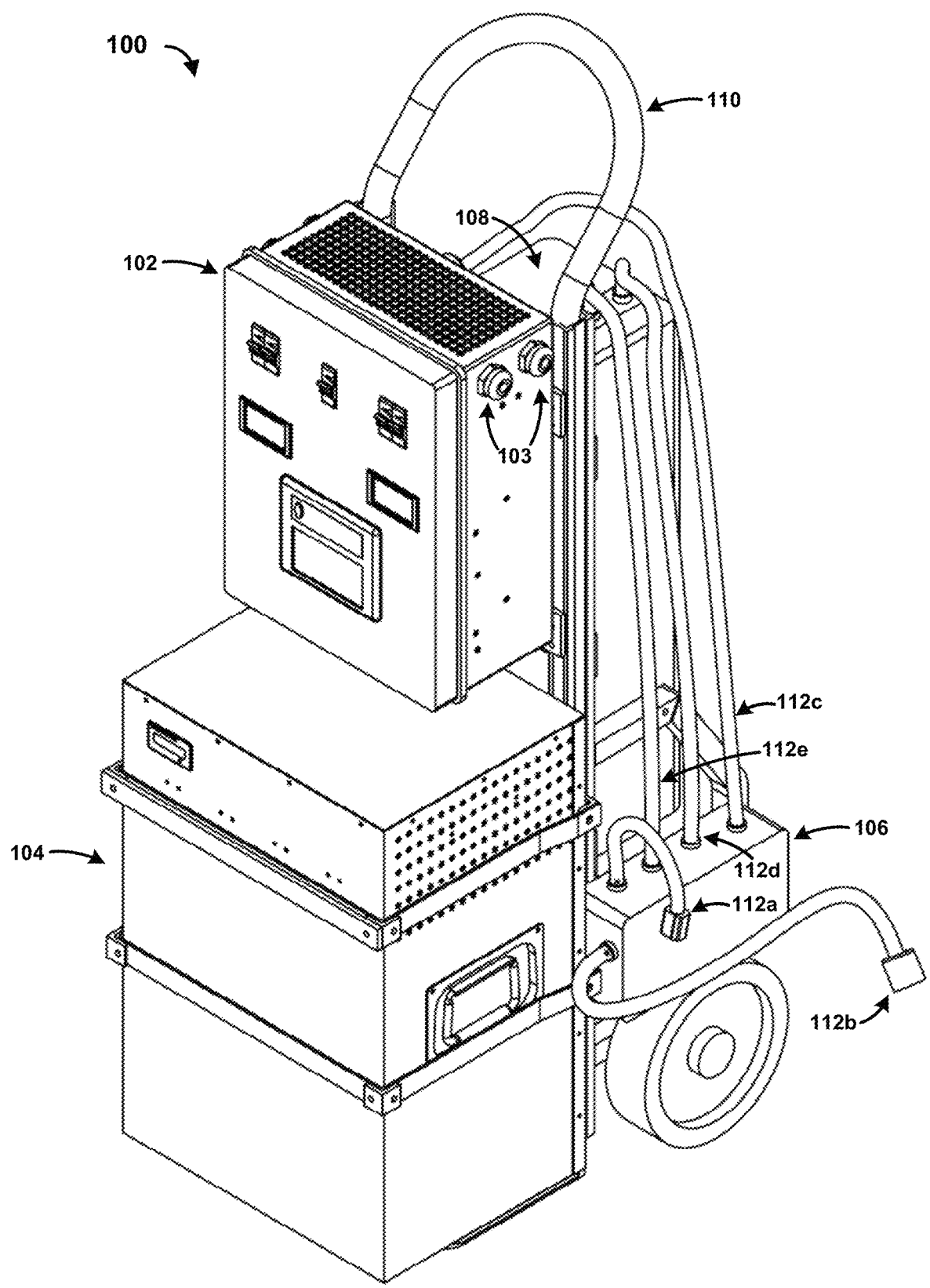
FIGS. 1A-1C illustrate an example system for providing power.

Before the present methods and systems are disclosed and described, it is to be understood that the methods and systems are not limited to specific methods, specific components, or to particular implementations. It is also to be understood that the terminology used herein is for the purpose of describing particular examples only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another example includes from the one particular value and/or to the other particular value. Similarly, when values are expressed as approximations, by use of the antecedent "about," it will be understood that the particular value forms another example. It will be further understood that the endpoints of each of the ranges are significant both in relation to the other endpoint, and independently of the other endpoint.

"Optional" or "optionally" means that the subsequently described event or circumstance may or may not occur, and that the description includes examples where said event or circumstance occurs and examples where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal example. "Such as" is not used in a restrictive sense, but for explanatory purposes.

Described herein are components that may be used to perform the described methods and systems. These and other components are described herein, and it is understood that when combinations, subsets, interactions, groups, etc. of these components are described that while specific reference of each various individual and collective combinations and permutation of these may not be explicitly described, each is specifically contemplated and described herein, for all methods and systems. This applies to all examples of this application including, but not limited to, steps in described methods. Thus, if there are a variety of additional steps that may be performed it is understood that each of these additional steps may be performed with any specific example or combination of examples of the described methods.

The present methods and systems may be understood more readily by reference to the following description of preferred examples and the examples included therein and to the Figures and their previous and following description.

The methods and systems are described below with reference to block diagrams and flowcharts of methods, systems, apparatuses and computer program products. It will be understood that each block of the block diagrams and flowcharts, and combinations of blocks in the block diagrams and flowcharts, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowcharts support combinations of means for performing the specified functions, combinations of steps for performing the specified functions and program instruction means for performing the specified functions. It will also be understood that each block of the block diagrams and flowcharts, and combinations of blocks in the block diagrams and flowcharts, may be implemented by special purpose hardware-based computer systems that perform the specified functions or steps, or combinations of special purpose hardware and computer instructions.

Provided are methods, systems, and apparatuses for protecting various critical instrumentation and control circuits, as well as power circuits, when a primary power source fails (e.g., a primary power source is disrupted, etc.) by generating power, transferring power, and/or performing analysis (e.g., voltage measurements, power measurements, frequency analysis, system impedance testing, etc.). Various systems for generating and providing power are described. Each system for generating and providing power described herein may provide power to a load (e.g., critical pieces of equipment, etc.) via an apparatus configured to securely attach to a power distribution component associated with the load, such as a fuse block. For example, components of the apparatus may be configured (e.g., machined, etc.) with dimensions that complement/correspond to a fuse block and enable the apparatus to securely fit and/or attach to opposing conductive contacts (e.g., fuse contacts, etc.) of the fuse block.

In some instances, the apparatus may be used for testing, measurements, and/or analysis. For example, the apparatus may securely fit and/or attach to opposing conductive contacts (e.g., fuse contacts, etc.) of a fuse block and/or related components and isolate electrical conduction through either of the opposing conductive contacts. A testing, measurement, and/or analysis device/component may attach to the apparatus and perform testing, measurements, and/or analysis on any component, device and/or the like attached to the non-isolated conductive contact.

Figure 1B:
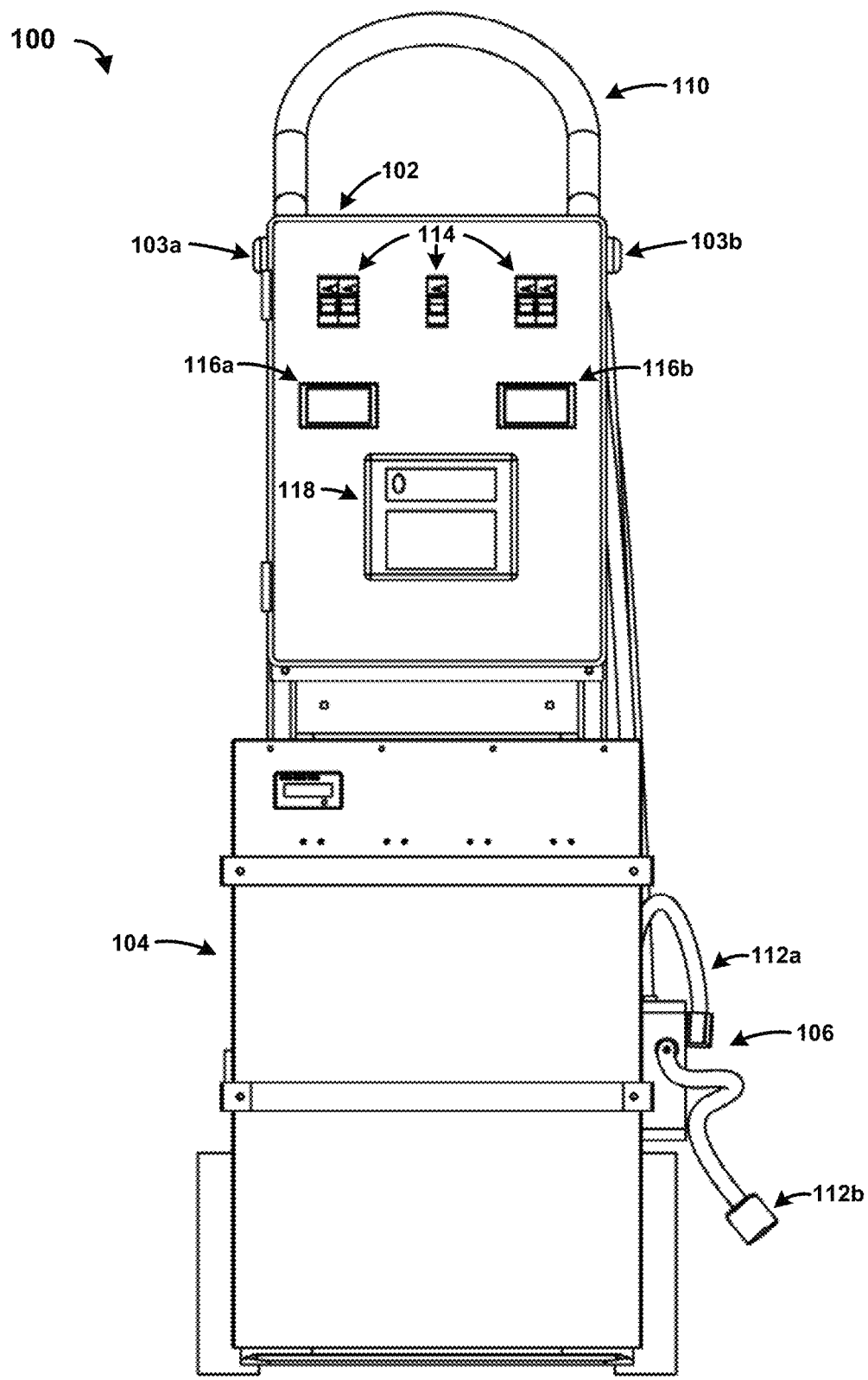
Figure 1C:
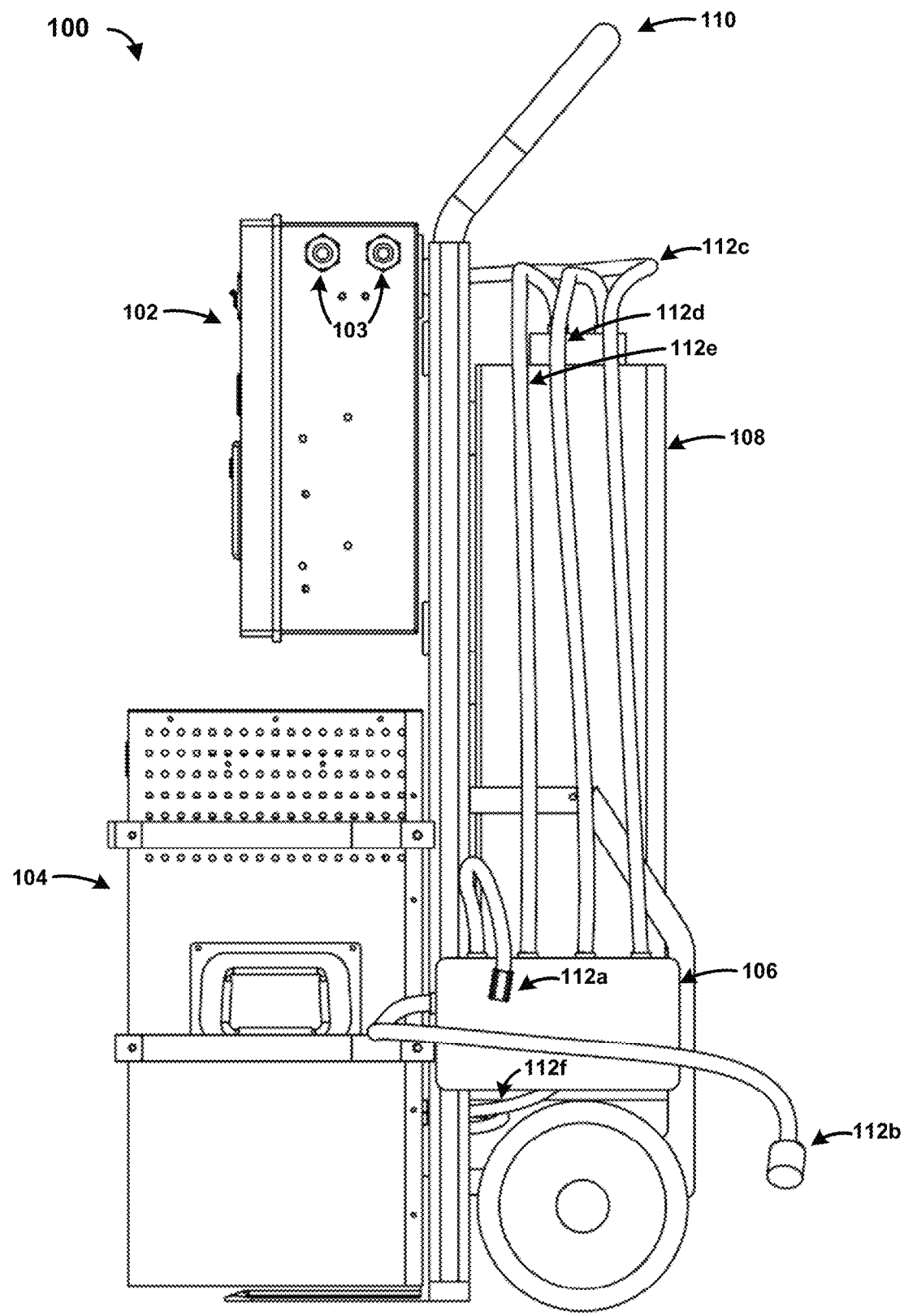

FIGS. 1A-1C illustrate an exemplary system 100 for providing power. As shown in FIG. 1A, the system 100 has a control module 102, a battery 104, a transfer switch 106, and an inverter 108. In an exemplary embodiment, the system 100 is coupled with a cart 110 such that the system 100 is a portable system.

The control module 102 can have an input/output interface (I/O), an interface, one or more outputs 103, an auxiliary port, switches, and so forth. The I/O can allow the control module 102 to communicate with one or more devices. The I/O can include any type of suitable hardware for communication with devices. For example, the I/O can include direct connection interfaces such as Ethernet and Universal Serial Bus (USB), as well as wireless communications, including but not limited to, Wi-Fi, Bluetooth, cellular, Radio Frequency (RF), and so forth. The control module 102 can provide power to the output 103 of the control module 102. For example, the control module 102 can receive power from at least one of the transfer switch 106 and/or the inverter 108, and the control module 102 can provide the received power on the output 103 to power one or more devices. As an example, one or more cables can be connected to the output 103 to couple the control module 102 to the one or more devices, and the control module 102 can provide the one or more devices power via the one or more cables connected to the output 103. The control module 102 can be removable from the cart 110 and still remain functional. For example, the control module 102 can be relocated a distance away from the cart 110, and the control module 102 can be coupled to the system 100 via one or more cables (e.g., the electrical connection 112c) coupled to the control module 102.

The battery 104 can be one or more batteries configured to store power, as well as provide the stored power. The battery 104 can provide DC power. The battery 104 can have an associated voltage, such as a 12 V, 24 V, 48 V, 125 V, 250 V, 400 V, etc. battery. Further, the battery 104 can have an output current. For example, the battery 104 can output 5 A, 50 A, 150 A, 300 A, etc. In an exemplary embodiment, the battery 104 can be a 12 V battery with a rated output of up to 150 A. In another exemplary embodiment, the battery 104 can be a 24 V battery with a rated output of up to 300 A. As will be appreciated by one skilled in the art, the battery 104 can be a battery with any voltage and/or current characteristics.

The battery 104 can be any battery, such as rechargeable batteries or non-rechargeable batteries. The battery 104 can be a Lithium Ion (Li+) battery, a lead acid (Pb) battery, a Lithium Iron Phosphate (LiFePo) battery, or any type of rechargeable battery. The battery 104 comprises an auxiliary output. The auxiliary output can be capable of receiving and/or providing DC power to another device. For example, an apparatus capable of running on DC power can be coupled to the battery 104 to receive power from the battery 104. As an example, a light can be coupled to the battery 104. As another example, an apparatus capable of providing DC power can be coupled to the 104. As an example, a maintenance battery charger can be coupled to the battery 104 to charge the battery 104.

The battery 104 can be one or more batteries configured to store power from the inverter 108. For example, the battery 104 can receive power from the inverter 108 via an electrical connection and store the power from the inverter 108. Stated differently, the inverter 108 can charge the battery 104 via the electrical connection. Additionally, the battery 104 can provide power to the inverter 108. For example, the battery 104 can discharge (e.g., provide power) to the inverter 108 via the electrical connection. Accordingly, the battery 104 is capable of receiving power from the inverter 108, as well as providing power to the inverter 108.

The transfer switch 106 can comprise any switch capable of switching between two or more power sources. For example, the transfer switch 106 can receive power from a generator (not shown) that is coupled with the transfer switch 106 via one or more electrical connections 112a,b. The transfer switch 106 can provide the received power to the inverter 108 via an electrical connection. Alternatively, the transfer switch 106 can provide the received power to the control module 102 via an electrical connection. The transfer switch 106 can comprise an adjustable voltage proving time delay module. The adjustable voltage proving time delay module can be configured to variably set at least one of a voltage delay trigger or a time delay trigger when an AC presence is detected on the electrical connection. That is, the adjustable voltage proving time delay module can be configured to set a voltage delay trigger upon receiving power from the generator. The transfer switch 106 can provide power to the control module 102 after triggering the adjustable voltage proving time delay module. That is, once the transfer switch 106 detects power from the generator via the electrical connection, the transfer switch 106 can provide power to the control module 102 via a different electrical connection.

The transfer switch 106 can have electrical connections 112a,b,c,d,e that are capable of providing power to, or receiving power from, another device. For example, the electrical connections 112a,b,c,d,e can provide power to, or receive power from, the control module 102, the battery 104, and/or the inverter 108. The electrical connections 112a,b,c,d,e can be any suitable DC and/or AC electrical connection. For example, the electrical connection 112a can be configured to provide power to another device. As an example, the electrical connection 112a can provide power to an auxiliary device, such as a work light or another electrical device. In an exemplary embodiment, the electrical connection 112a provides power to a power providing device (e.g., a distribution hub) that facilitates providing AC and/or DC power to one or more other devices. The electrical connection 112b can be configured to receive power from a generator (not shown). The electrical connection 112c can be configured to provide power to the control module 102. The electrical connections 112d,e can be configured to provide power to, or receive power from, the inverter 108. Thus, the transfer switch 106 can utilize the electrical connections 112a,b,c,d,e to provide power to, or receive power from, another device.

Additionally, the transfer switch 106 can receive power from the inverter 108. In an exemplary embodiment, the transfer switch 106 can switch receiving power between the generator and the inverter 108. Stated differently, the transfer switch 106 can auctioneer between the generator and the inverter 108. That is, the transfer switch 106 can automatically switch between the generator and the inverter 108. For example, if the generator runs out of fuel, the transfer switch 106 can switch to receiving power from the inverter 108, which is receiving power from the battery 104. In this manner, the transfer switch 106 can continue to output power to the control module 102 even if one of the power sources of the transfer switch 106 (e.g., the generator, the battery 104) stops providing power to the transfer switch 106.

The inverter 108 can be any device capable of converting AC power to DC power, as well as DC power to AC power. The inverter 108 can receive power from a generator via an electrical connection or can receive power from the transfer switch 106. For example, the inverter 108 can receive AC power directly from the generator or from the transfer switch 106. The inverter 108 can provide the received AC power to the control module 102 via an electrical connection. The inverter 108 can convert the received AC power to DC power. The inverter 108 can provide (e.g., output) the DC power to the battery 104 via an electrical connection. As an example, the inverter 108 can charge the battery 104 via the electrical connection. The inverter 108 can charge the battery 104, while also providing AC power to an output, such as the control module 102. That is, the inverter 108 is capable of charging the battery 104, while simultaneously providing power to the control module 102.

Further, the inverter 108 can receive DC power from the battery 104. For example, the inverter 108 can receive 12 VDC 24 VDC, 48 VDC, 72 VDC, as well as voltages ranging from 100 VDC to 800 VDC. The inverter 108 can invert (e.g., convert) the received DC power to AC power. The inverter 108 can output the inverted AC power. For example, the inverter 108 can output 110 VAC, 120 VAC, 208 VAC three-phase, 480 VAC three-phase, or any suitable output. The inverter 108 can provide the inverted AC power to the control module 102 via an electrical connection. For example, the inverter 108 can comprise an internal transfer switch. The internal transfer switch can be capable of auctioneering AC power output to the control module 102 between two or more electrical inputs. For example, one electrical input may be a generator (not shown), and the other may be provided by the battery 104. Stated differently, the inverter 108 is capable of switching (e.g., automatically) between power inputs in order to maintain a constant output to the control module 102. The inverter 108 can have one or more indicators that indicate the status of the inverter 108. For example, the inverter 108 can have one or more lights and/or displays that indicate the status of the inverter. In an exemplary embodiment, the lights comprise Light Emitting Diodes (LEDs).

FIG. 1B illustrates a front view of the system 100. As shown, the control module 102 has outputs 103a,b, a plurality of switches 114, two displays 116a,b, and a control interface 118. The outputs 103a,b can output DC power and/or AC power. The outputs 103a,b can output the same or different type of power, as well as the same or different amount of power. For example, the output 103a can be associated with a first power output (e.g., DC power and/or AC power), and the output 103b can be associated with a second power output (e.g., DC power and/or AC power). As an example, the output 103a can output a first DC voltage, and the output 103b can output a second DC voltage. As another example, the output 103a can output a first AC voltage, and the output 103b can output a second AC voltage. As further example, the output 103a can output a DC voltage, and the output 103b can output an AC voltage.

The switches 114 can toggle the output provided by the control module 102. That is, the outputs 103a,b can be controlled by the switches 114. For example, the switches 114 can be associated with breakers that determine whether the control module 102 provides power to the outputs 103a,b. As an example, the switches 114 can be individually flipped to control the outputs 103a,b such that the output of the control module 102 can be modified based on the position of the switch 114. Further, one of the switches 114 may be a power switch that toggles the control module 102 between an off state and an on state.

The control module 102 can have two displays 116a,b. The two displays 116a,b can indicate the status of the control module 102. For example, the two displays 116a,b can indicate the output of the control module 102. As an example, the two displays 116a,b can be associated with a specific output of the control module 102, and the two displays 116a,b can indicate the voltage and current presently being supplied by the respective output.

The control module 102 can have a control interface 118. The control interface 118 can have any capability for controlling operation of the inverter 108. For example, the control interface 118 can control the power provided to the inverter 108. That is, the control interface 118 can have the capability to turn the inverter 108 ON and OFF. The control interface 118 can also indicate the status of the inverter 108. For example, the control interface 118 can indicate whether the inverter 108 is receiving power from the battery 104 or a generator (not shown). As another example, the control interface 118 can indicate whether the battery 104 is being charged by the power being provided by the generator via the transfer switch 106. The control interface 118 can dictate the operation of the inverter 108. For example, the control interface 118 can instruct the inverter 108 to draw power from the battery 104, rather than the generator. Similarly, the control interface 118 can instruct the inverter 108 to draw power from the generator, rather than the battery 104. While the control interface 118 is described as controlling operation of the inverter, a person of ordinary skill in the art would appreciate that the control interface 118 can be capable of controlling operation of the control module 102, the battery 104, and/or the transfer switch 106.

FIG. 1C illustrates a side view of the system 100. Specifically, FIG. 1C illustrates the electrical connections 112a,b,c,d,e,f between the control module 102, the battery 104, the transfer switch 106, and the inverter 108. As shown, the transfer switch 106 is coupled to the inverter 108 via two electrical connections 112e,d. Further, the control module 102 is coupled with the transfer switch 106 via a single electrical connection 112c. Similarly, the battery 104 is coupled with the transfer switch 106 via a single electrical connection 112f.

Figure 2:
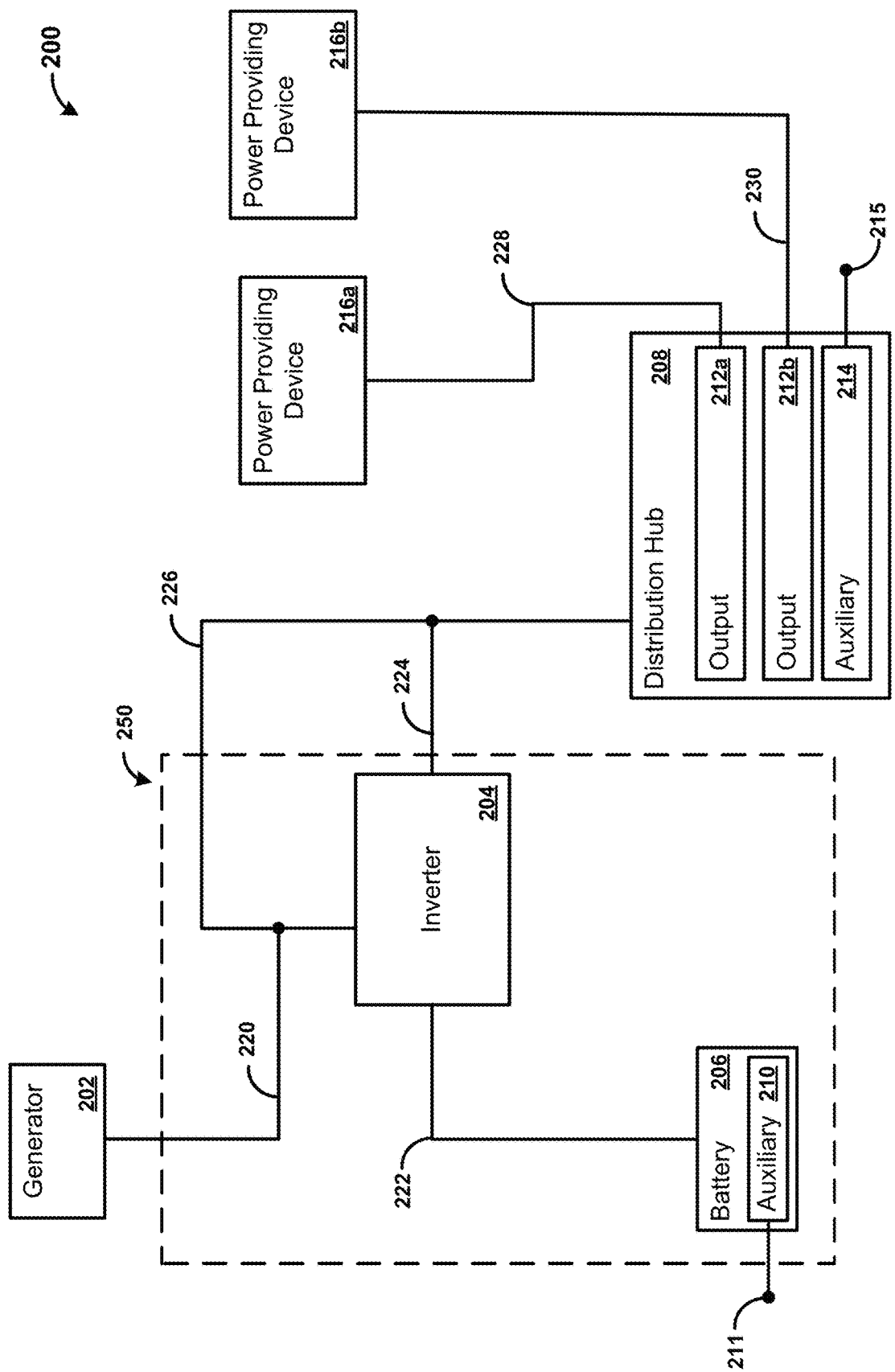
FIG. 2 illustrates an example system for providing power.

FIG. 2 illustrates an exemplary system 200 for providing power. As shown, the system 200 has a generator 202, an inverter 204, a battery 206, and a distribution hub 208. Further, the system 200 comprises an apparatus 250. The apparatus 250 can comprise the inverter 204 and the battery 206. Additionally, the apparatus 250 can comprise any of the components of the system 200. For example, the apparatus 250 comprises the cart 110 of FIGS. 1A-1C. In an exemplary embodiment, each of the components of the system 200 are separate devices that are not contained within an apparatus.

The generator 202 can be any generator capable of providing power. For example, the generator 202 can be capable of Alternating Current (AC). The generator 202 can output between 100 VAC and 250 VAC, as well as higher voltages. For example, the generator 202 can output 120

VAC and/or 240 VAC. The generator 202 can operate on any suitable fuel, such as gasoline, diesel, Liquid Propane Gas (LPG), natural gas, and so forth. The generator 202 can operate on two or more fuels. For example, the generator 202 can be capable of operating on both gasoline and LPG. The generator 202 can be capable of switching between the two fuels either manually or automatically. As an example, the generator 202 can default to running on gasoline stored within a gas tank associated with the generator 202. Once the generator 202 runs out of gasoline within the gas tank, the generator 202 can switch over to the LPG. As another example, the generator 202 can switch between two or more LPG tanks coupled with the generator 202. That is, when a first of the two or more LPG tanks runs out of the LPG, the generator 202 can manually, or automatically, switch to a second of the two or more LPG tanks. The generator 202 can provide (e.g., output) power to the inverter 204 via an electrical connection 220. For example, the generator 202 can provide AC power to the inverter 204 via the electrical connection 220. Further, the generator 202 can provide power to the distribution hub 208 via the electrical connection 220 and an electrical connection 226. Stated differently, the generator 202 can bypass the inverter 204 and provide power directly to the distribution hub 208.

The inverter 204 can be any device capable of converting AC power to DC power, as well as DC power to AC power. For example, the inverter 204 can be a rectifier. The inverter 204 can receive power from the generator 202 via the electrical connection 222. For example, the inverter 204 can receive AC power from the generator 202 via the electrical connection 222. The inverter 204 can provide the received AC power to the distribution hub 208 via an electrical connection 226. The inverter 204 can convert the received AC power to DC power. The inverter 204 can provide (e.g., output) the DC power to the battery 206 via an electrical connection 224. As an example, the inverter 204 can charge the battery 206 via the electrical connection 224. The inverter 204 can charge the battery 206, while also providing AC power to the distribution hub 208. That is, the inverter 204 is capable of charging the battery 206, while simultaneously providing power to the distribution hub 208.

Further, the inverter 204 can receive DC power from the battery 206. For example, the inverter 204 can receive 12 VDC 24 VDC, 48 VDC, 72 VDC, as well as voltages ranging from 100 VDC to 800 VDC. The inverter 204 can invert (e.g., convert) the received DC power to AC power. The inverter 204 can output the inverted AC power. For example, the inverter 204 can output 110 VAC, 120 VAC, 208 VAC three-phase, 480 VAC three-phase, or any suitable output. The inverter 204 can provide the inverted AC power to the distribution hub 208 via an electrical connection 224. For example, the inverter 204 can comprise an internal transfer switch. The internal transfer switch can be capable of auctioneering AC power output to the distribution hub 208 between the electrical connection 220 (e.g., that is provided by the generator 202) and the electrical connection 222 (e.g., that is provided by the battery 206). Stated differently, the inverter 204 is capable of switching (e.g., automatically) between power inputs received from the generator 202, via the electrical connection 220, and from the battery 206, via the electrical connection 222, in order to maintain a constant output to the distribution hub 208, via the electrical connection 224. The inverter 204 can have one or more indicators that indicate the status of the inverter 204. For example, the inverter 204 can have one or more lights and/or displays that indicate the status of the inverter. In an exemplary embodiment, the lights comprise Light Emitting Diodes (LEDs).

The battery 206 can be one or more batteries configured to store power, as well as provide the stored power. The battery 206 can provide DC power. The battery 206 can have an associated voltage, such as a 12 V, 24 V, 48 V, 125 V, 250 V, 400 V, etc. battery. Further, the battery 206 can have an output current. For example, the battery 206 can output 5 A, 50 A, 150 A, 300 A, etc. In an exemplary embodiment, the battery 206 can be a 12 V battery with a rated output of up to 150 A. In another exemplary embodiment, the battery 206 can be a 24 V battery with a rated output of up to 300 A. As will be appreciated by one skilled in the art, the battery 206 can be a battery with any voltage and/or current characteristics.

The battery 206 can be any battery, such as rechargeable batteries or non-rechargeable batteries. The battery 206 can be a Lithium Ion (Li+) battery, a lead acid (Pb) battery, a Lithium Iron Phosphate (LiFePo) battery, or any type of rechargeable battery. The battery 206 comprises an auxiliary output 210. The auxiliary output 210 is capable of receiving and/or providing DC power to another device. For example, an apparatus capable of running on DC power can be coupled to the auxiliary output 210. As an example, a light can be coupled to the auxiliary output 210. As another example, an apparatus capable of providing DC power can be coupled to the auxiliary output 210. As an example, a maintenance battery charger can be coupled to the auxiliary output 210 to charge the battery 206.

The battery 206 can be one or more batteries configured to store power from the inverter 204. For example, the battery 206 can receive power from the inverter 204 via the electrical connection 222 and store the power from the inverter 204. Stated differently, the inverter 204 can charge the battery 206 via the electrical connection 222. Additionally, the battery 206 can provide power to the inverter 204. For example, the battery 206 can discharge (e.g., provide power) to the inverter 204 via the electrical connection 222. Accordingly, the battery 206 is capable of receiving power from the inverter 204, as well as providing power to the inverter 204. The distribution hub 208 can receive power from the generator 202 via the electrical connections 222 and 228. Additionally, the distribution hub 208 can receive power from the inverter via the electrical connection 226. The distribution hub 208 can comprises two or more outputs 212*a,b* and an auxiliary 214.

The distribution hub 208 can provide AC power to the outputs 212*a,b*. For example, the distribution hub 208 can provide between 100-250 VAC power to the outputs 212*a,b*. The outputs 212*a,b* provide power to two or more power providing devices 216*a,b*. Specifically, the output 212*a* can provide power to the power providing device 216*a* via the electrical connection 228, and the output 212*b* can provide power to the power providing device 216*b* via the electrical connection 230. In an exemplary embodiment, the electrical connections 228, 230 comprise cables coupled with the distribution hub 208 and the power providing devices 216*a,b*. The power providing devices 216*a,b* can provide a variety of different power outputs. For example, the power providing devices 216*a,b* can provide AC power and DC power. As an example, the power providing device 216*a,b* can provide AC power and DC power simultaneously. The power output provided by the power providing devices 216*a,b* can be between 0-260 VDC, such as 24 VDC, 48 VDC, 125 VDC, as well as 0-250 VAC, such as, 120 VAC, 240 VAC, or any suitable DC and/or AC output. The power providing devices 216a,b can have more than one output port associated with each of the power providing devices 216a,b such that the power providing devices 216a,b can provide power to a plurality of devices simultaneously.

The distribution 208 can have an auxiliary 214. The auxiliary 214 can provide power to one or more additional devices via an output connection 215. For example, the auxiliary 214 can couple the distribution hub 208 to another distribution hub. Stated differently, the auxiliary 214 provides the distribution hub 208 the capability to power one or more additional distribution hubs in order to provide additional power providing devices 216a,b. That is, the auxiliary 214 can have the capability to act as a pass through that matches the voltage of the AC input provided to the distribution hub 208. The auxiliary 214 can provide 120 VAC, 240 VAC, and/or any AC power output. The auxiliary 214 can be an auxiliary output for providing power to an auxiliary device, such as a light, a power tool, or any electrical device. As another example, the auxiliary 214 can be an interface (e.g., a display, a light, etc.) that provides information associated with the distribution hub 208. As a further example, the auxiliary 214 can be an Input/Output (I/O) interface for communicating with one or more additional electronic devices.

While the electrical connections 220-230 are shown as direct connections between the various components of the system 200 for ease of explanation, a person skilled in the art would appreciate that the electrical connections 220-230 can comprise additional components, such as resistors, capacitors, inductors, breakers, switches, and so forth.

Figure 3:
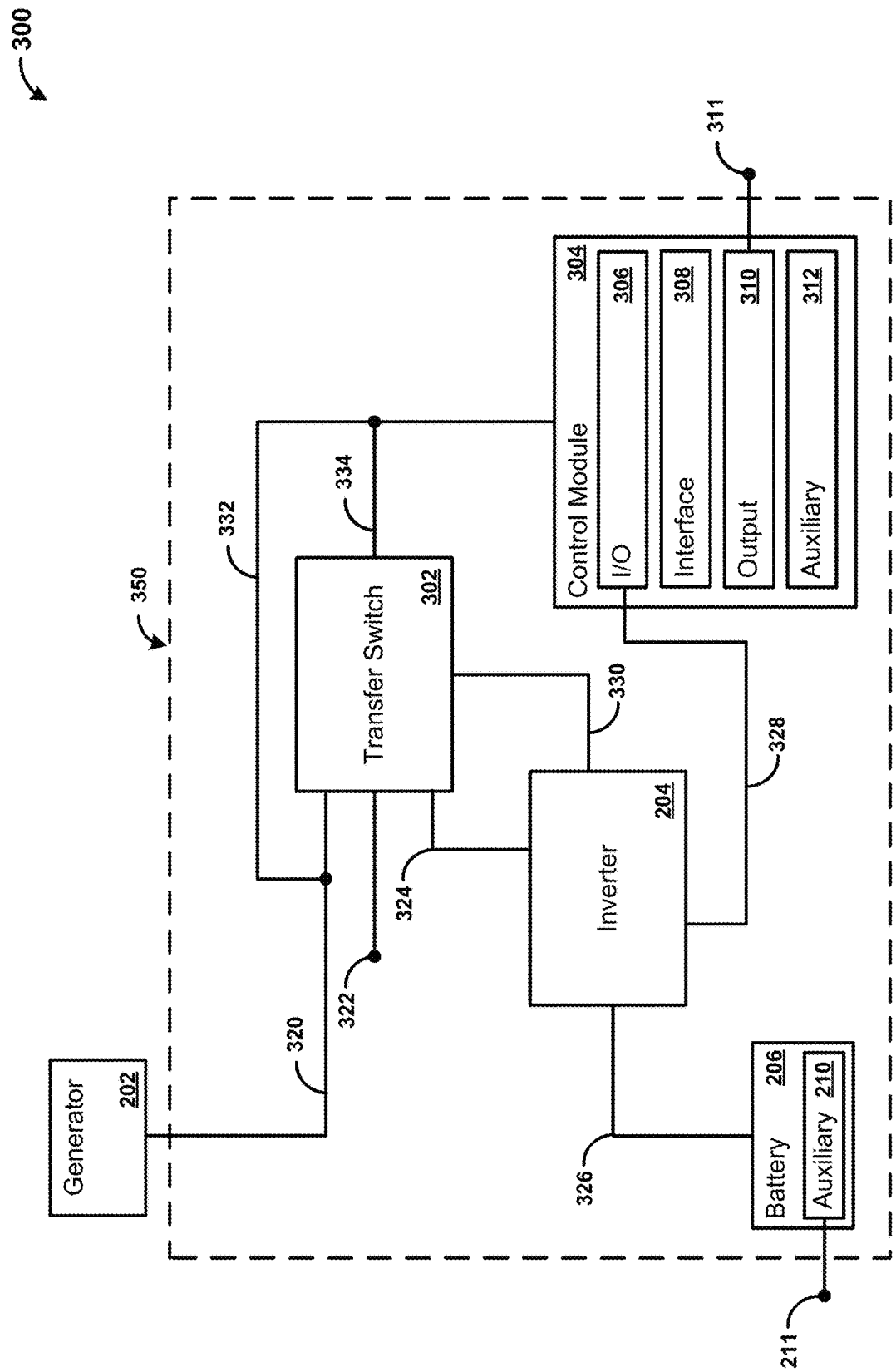
FIG. 3 illustrates an example system for providing power.

FIG. 3 illustrates an exemplary system 300 for providing power. Specifically, the system 300 has the generator 202, a transfer switch 302, an inverter 204, a battery 206, and a control module 304. Further, the system 300 has an apparatus 350 that can comprise the functionality of the transfer switch 302, the inverter 204, the battery 206, and the control module 304. The apparatus 350 (e.g., the cart 110 of FIGS. 1A-1C) can comprise a wheeled container configured to mount the one or more of the transfer switch 302, the inverter 204, the battery 206, and the control module 304.

The generator 202 provides power to the transfer switch 302 via the electrical connection 320. The generator 220 also provides power to the control module 304 via the electrical connection 320 and an electrical connection 332. While the control module 304 is illustrated as being within the apparatus 350, the control module 304 is capable of being removed from the apparatus and still function appropriately. For example, the control module 304 can receive power from one or more cables that are connected to the transfer switch 302, the generator 202, and/or the inverter 204. Thus, the control module 304 can be located outside of the apparatus 350 and still function as described herein.

The transfer switch 302 can comprise any switch capable of switching between two or more power sources. As shown, the transfer switch 302 can receive power from the generator 202. The transfer switch 302 can provide the received power to the inverter 204 via an electrical connection 324. Alternatively, the transfer switch 302 can provide the received power to the control module 304 via an electrical connection 334. The transfer switch 302 can comprise an adjustable voltage proving time delay module. The adjustable voltage proving time delay module can be configured to variably set at least one of a voltage delay trigger or a time delay trigger when an AC presence is detected on the electrical connection 320. That is, the adjustable voltage proving time delay module can be configured to set a voltage delay trigger upon receiving power from the generator 202. The transfer switch 302 can provide power to the control module 304 after triggering the adjustable voltage proving time delay module. That is, once the transfer switch 302 detects power from the generator 202 via the electrical connection 320, the transfer switch 302 can provide power to the control module 304 via the electrical connection 334.

The transfer switch 302 can have an auxiliary electrical connection 322 that is capable of providing power to another device. The auxiliary electrical connection 322 can provide power to one or more additional devices. For example, the auxiliary electrical connection 322 can couple the transfer switch 302 to a distribution hub (e.g., the distribution hub 208 of FIG. 2) or another control module (e.g., another control module 304). Stated differently, the auxiliary electrical connection 322 provides the transfer switch 302 the capability to power one or more additional distribution hubs in order to provide additional power providing devices. The auxiliary electrical connection 322 can provide 120 VAC, 240 VAC, and/or any AC power output. The auxiliary electrical connection 322 can be an auxiliary output for providing power to an auxiliary device, such as a light, a power tool, or any electrical device.

Additionally, the transfer switch 302 can receive power from the inverter 204 via the electrical connection 330. In an exemplary embodiment, the transfer switch 302 can switch receiving power between the generator 202 and the inverter 204. Stated differently, the transfer switch 302 can auctioneer between the generator 202 and the inverter 204. That is, the transfer switch 302 can automatically switch between the generator 202 and the inverter 204. For example, if the generator 202 runs out of fuel, the transfer switch 302 can switch to receiving power from the inverter 204. In this manner, the transfer switch 302 can continue to output power to the control module 304 via the electrical connection 334 even if one of the power sources of the transfer switch 302 (e.g., the generator 202, the battery 206) stops providing power to the transfer switch 302.

The inverter 204 can provide power to the battery 206, as well as receive power from the battery 206 via the electrical connection 326. The inverter 204 can provide the power received from the battery 206 to the transfer witch 302 via the electrical connection 330. Additionally, the inverter 204 can be coupled with the I/O 306 of the control module 304 via an electrical connection 328. The inverter 204 can be controlled via the electrical connection 328. For example, the inverter 204 can be toggled on/off. Further, the inverter 204 can provide data via the connection 328. As an example, the inverter 204 can provide alarms and/or operating status indications to the control module 304. The control module 304 can modify the operation of the inverter 204 based on the alarms and/or the operating status indications.

The control module 304 can have an input/output interface (I/O) 306, an interface 308, an output 310, and the auxiliary port 312. The control module 304 can provide power to, or receive power from, the auxiliary port 312. The I/O 306 can allow the control module 304 to communicate with one or more devices. The I/O 306 can include any type of suitable hardware for communication with devices. For example, the I/O 306 can include direct connection interfaces such as Ethernet and Universal Serial Bus (USB), as well as wireless communications, including but not limited to, Wi-Fi, Bluetooth, cellular, Radio Frequency (RF), and so forth.

The interface 308 can comprise any interface capable of displaying information. For example, the interface 308 can be a digital display that indicates the power usage of the control module 304. As an example, the interface 308 can indicate the current and voltage being output by the control module 304 via the output 310. The output 310 can provide either AC or DC power to one or more devices via an output connection 311. For example, the output 310 can provide be 0-24 VDC, 48 VDC, 125 VDC, 120 VAC, 240 VAC, and so forth power to the one or more devices.

While the electrical connections 320-334 are shown as direct connections between the various components of the system 300 for ease of explanation, a person skilled in the art would appreciate that the electrical connections 320-334 can comprise additional components, such as resistors, capacitors, inductors, breakers, switches, and so forth.

Figure 4:
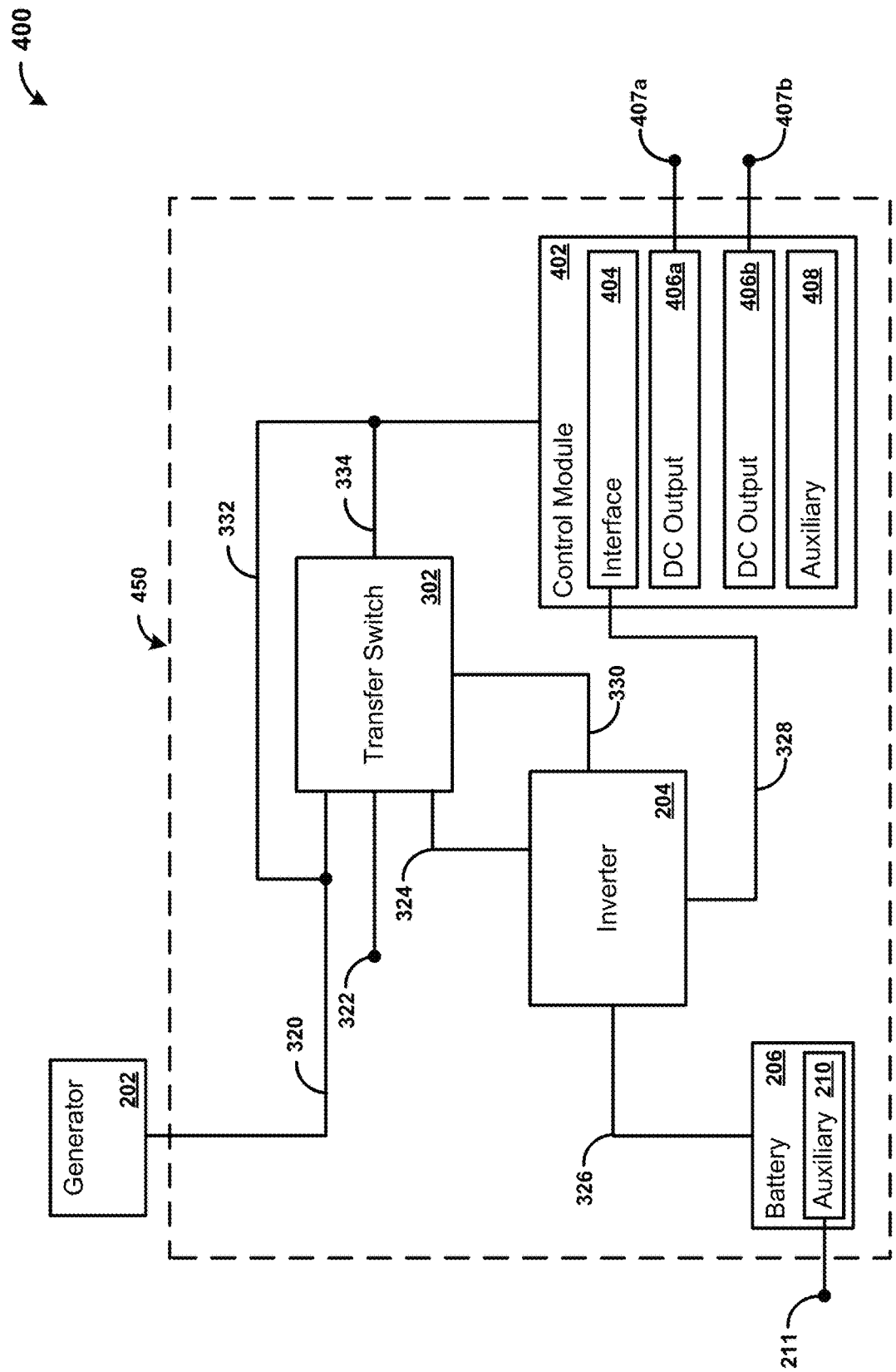
FIG. 4 illustrates an example system for providing power.

FIG. 4 illustrates an exemplary system 400 for providing power. The system 400 is the same as system 300 of FIG. 3, except that the control module 304 of the apparatus 350 has been replaced with control module 402 of the apparatus 450. For example, the apparatus 450 comprises the cart 110 of FIGS. 1A-1C. The control module 402 can have an interface 404, DC outputs 406a,b, and an auxiliary port 408.

The inverter 204 can be coupled with the interface 404 of the control module 402 via an electrical connection 328. The inverter 204 can be controlled via the electrical connection 328. For example, the inverter 204 can be toggled on/off. Further, the inverter 204 can provide data via the connection 328. As an example, the inverter 204 can provide alarms and/or operating status indications to the control module 402. The control module 402 can modify the operation of the inverter 204 based on the alarms and/or the operating status indications.

The interface 404 can comprise any interface capable of displaying information. For example, the interface 404 can be a digital display that indicates the power usage of the control module 402. As an example, the interface 404 can indicate the current and voltage being output by the control module 402 via the DC outputs 406a,b. The DC outputs 406a,b can provide any amount of DC power to one or more devices via output connections 407a,b. For example, the DC outputs 406a,b can provide be 0-24 VDC, 48 VDC, 125 VDC, 240 VDC, 400 VDC, and so forth. The DC outputs 406a,b can provide the same or different power outputs. For example, one of the DC outputs 406a,b outputs a DC voltage between 115-130 VDC, while the other outputs 240-260 VDC. The DC outputs 406a,b can provide power to a variety of DC powered devices, such as DC motors, DC motor operated valves, DC solenoids, DC control power logic circuits, and so forth.

The control module 402 can provide power to, or receive power from, the auxiliary port 408. The auxiliary port 408 can provide power to one or more additional devices. For example, the auxiliary port 408 can couple the control module 402 to another device (e.g., a distribution hub, a control module, etc.). That is, the auxiliary port 408 can have the capability to act as a pass through that matches the voltage of the AC input provided to the control module 402. The auxiliary port 408 can provide 120 VAC, 240 VAC, and/or any AC power output. The auxiliary port 408 can be an auxiliary output for providing power to an auxiliary device, such as a light, a power tool, or any electrical device.

While the electrical connections 320-334 are shown as direct connections between the various components of the system 400 for ease of explanation, a person skilled in the art would appreciate that the electrical connections 320-334 can comprise additional components, such as resistors, capacitors, inductors, breakers, switches, and so forth.

Figure 5:
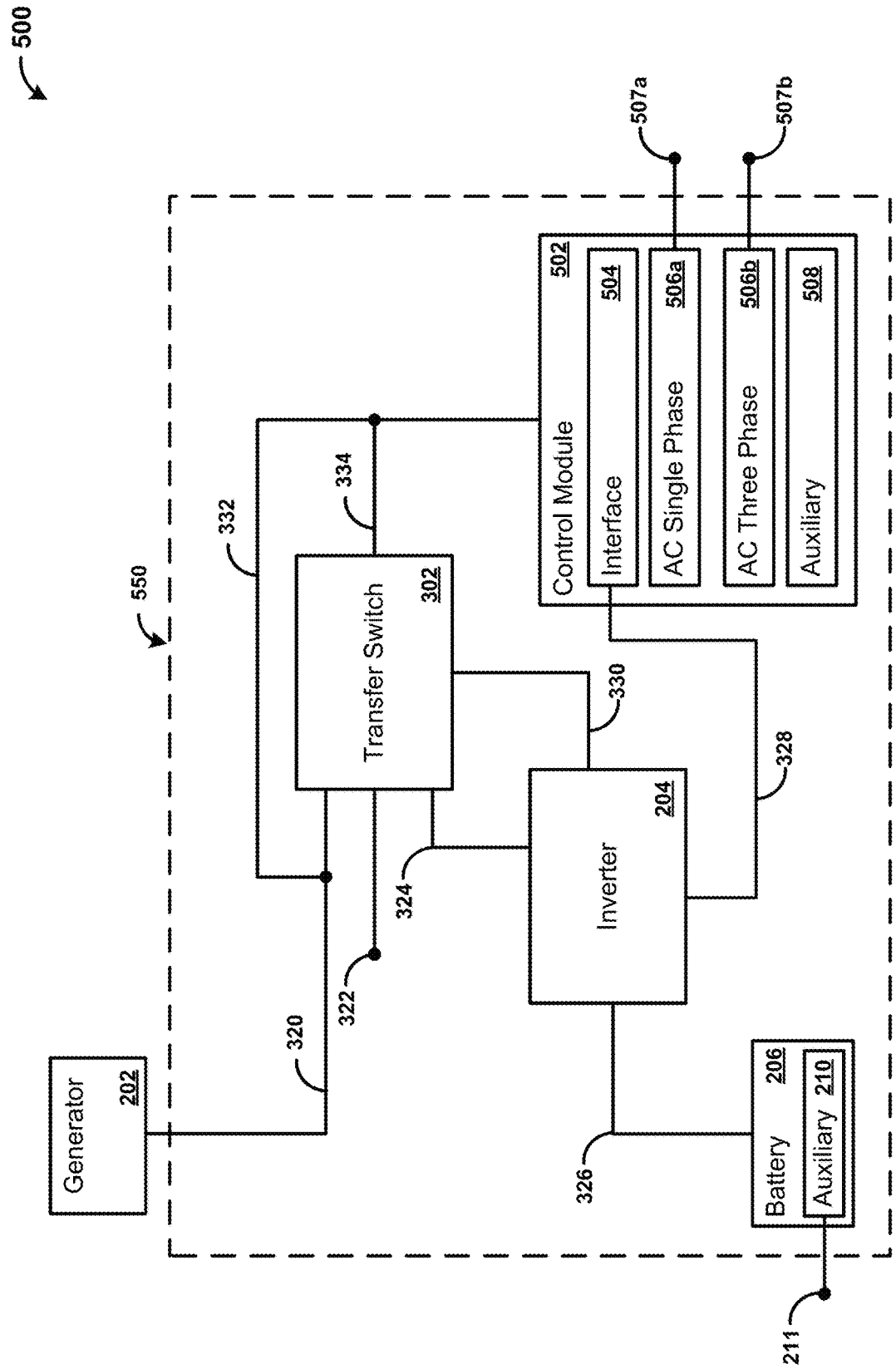
FIG. 5 illustrates an example system for providing power.

FIG. 5 illustrates an exemplary system 500 for providing power. The system 500 is the same as the system 300 of FIG. 3 and the system 400 of FIG. 4, except that the control module 304 of the apparatus 350 and the control module 402 of the apparatus 450 has been replaced with the control module 502 of the apparatus 550. For example, the apparatus 550 comprises the cart 110 of FIGS. 1A-1C. The control module 502 can have an interface 504, AC outputs 506a,b, and an auxiliary port 508.

The inverter 204 can be coupled with the interface 504 of the control module 502 via an electrical connection 328. The inverter 204 can be controlled via the electrical connection 328. For example, the inverter 204 can be toggled on/off. Further, the inverter 204 can provide data via the connection 328. As an example, the inverter 204 can provide alarms and/or operating status indications to the control module 502. The control module 502 can modify the operation of the inverter 204 based on the alarms and/or the operating status indications.

The interface 504 can comprise any interface capable of displaying information. For example, the interface 504 can be a digital display that indicates the power usage of the control module 502. As an example, the interface 504 can indicate the current and voltage being output by the control module 502 via the AC outputs 506a,b. The AC outputs 406a,b can provide any amount of AC power to one or more devices via output connections 507a,b. For example, the AC output 506a can be a single phase AC output, whereas the AC output 506b can be a three-phase AC output. The AC outputs 506a,b can provide the same or different output. For example, the AC outputs 506a,b can provide be 120 VAC, 240 VAC, 400 VAC, and so forth. The AC outputs 506a,b can provide power to a variety of AC powered devices such as any AC load, AC motors, AC motor operated valves, communication equipment, and so forth.

The control module 502 can provide power to, or receive power from, the auxiliary port 508. The auxiliary port 508 can provide power to one or more additional devices. For example, the auxiliary port 508 can couple the control module 502 to another device (e.g., a distribution hub, a control module, etc.). That is, the auxiliary port 508 can have the capability to act as a pass through that matches the voltage of the AC input provided to the control module 502. The auxiliary port 508 can provide 120 VAC, 240 VAC, and/or any AC power output. The auxiliary port 508 can be an auxiliary output for providing power to an auxiliary device, such as a light, a power tool, or any electrical device.

While the electrical connections 320-334 are shown as direct connections between the various components of the system 500 for ease of explanation, a person skilled in the art would appreciate that the electrical connections 320-334 can comprise additional components, such as resistors, capacitors, inductors, breakers, switches, and so forth.

Figure 6:
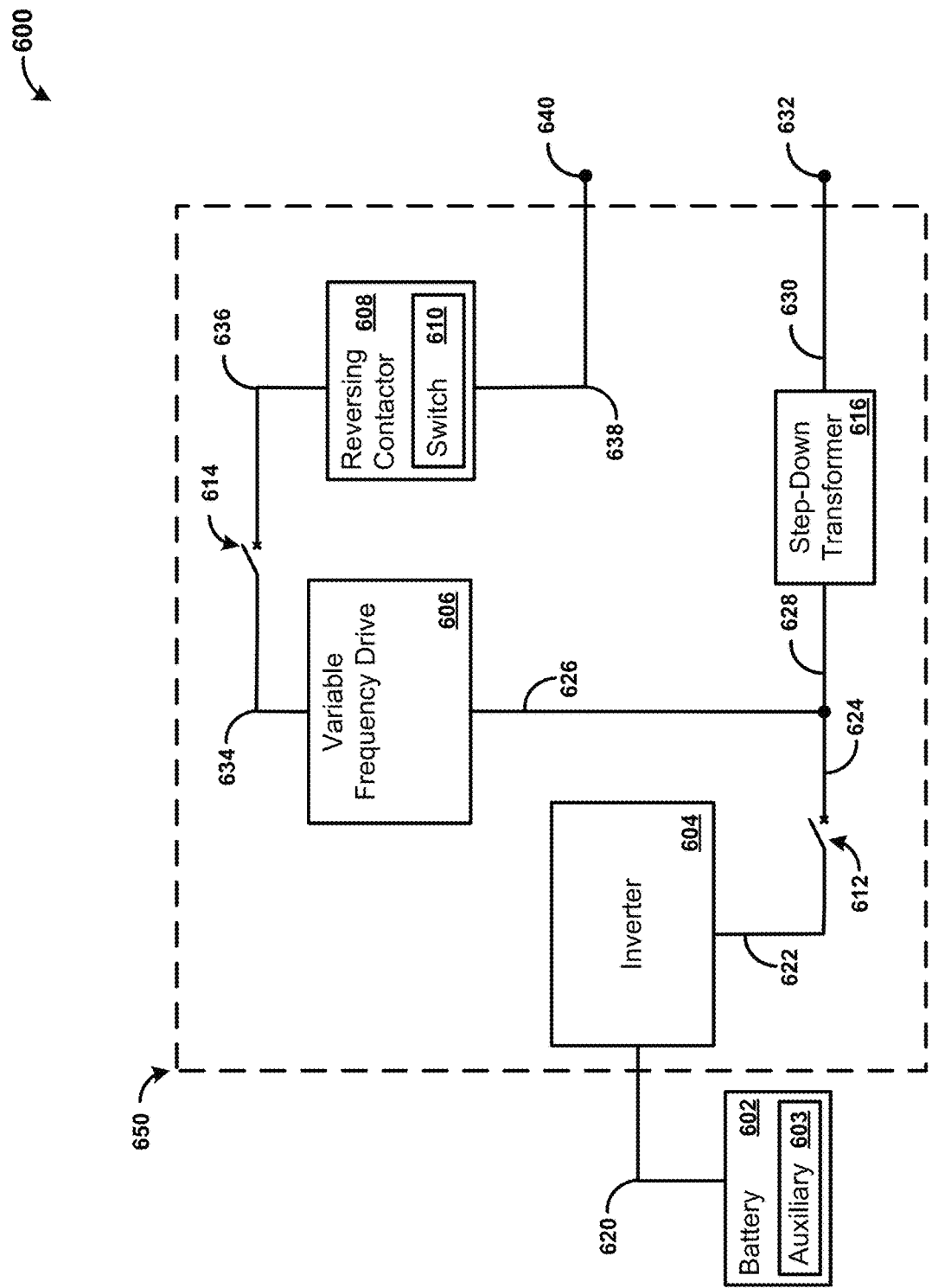
FIG. 6 illustrates an example system for providing power.

FIG. 6 illustrates an exemplary system 600 for providing power. The system 600 comprises a battery 602, an inverter 604, a variable frequency drive 606, and a reversing contactor 608. In an exemplary embodiment, the system 600 comprises an apparatus 650 which comprises an inverter 604, a variable frequency drive 606, and a reversing contactor 608. Additionally, while the battery 602 is illustrated as not being a part of the apparatus 650, in an exemplary embodiment, the apparatus 650 comprises the battery 602, as well as all the capabilities of the battery 602. For example, the apparatus 600 can comprise a portable container that is capable of providing power.

The battery 602 can be one or more batteries configured to store power, as well as provide the stored power. The battery 602 can provide DC power. The battery 602 can have an associated voltage, such as a 12 V, 24 V, 48 V, 125 V, 250 V, 400 V, etc. battery. Further, the battery 602 can have an output current. For example, the battery 602 can output 5 A, 50 A, 150 A, 300 A, etc. In an exemplary embodiment, the battery 602 can be a 12 V battery with a rated output of up to 150 A. In another exemplary embodiment, the battery 602 can be a 24 V battery with a rated output of up to 300 A. As will be appreciated by one skilled in the art, the battery 602 can be a battery with any voltage and/or current characteristics.

The battery 602 can be any battery, such as rechargeable batteries or non-rechargeable batteries. The battery 602 can be a Lithium Ion (Li+) battery, a lead acid (Pb) battery, a Lithium Iron Phosphate (LiFePo) battery, or any type of rechargeable battery. The battery 602 comprises an auxiliary output 603. The auxiliary output 603 can be capable of receiving and/or providing DC power to another device. For example, an apparatus capable of running on DC power can be coupled to the battery 602 to receive power from the battery 602 via the auxiliary output 603. As an example, a light can be coupled to the battery 602. As another example, an apparatus capable of providing DC power can be coupled to the battery 602. As an example, a maintenance battery charger can be coupled to the battery 602 via the auxiliary output 603 to charge the battery 602. Additionally, the battery 602 can provide power to the inverter 604. For example, the battery 602 can discharge (e.g., provide power) to the inverter 604 via the electrical connection 620.

The inverter 604 can be any device capable of converting DC power to AC power. The inverter 604 can receive DC power from the battery 602 via the electrical connection 620. The inverter 604 can convert (e.g., invert) the received DC power to AC power. The inverter 604 can provide the converted AC power to the electrical connection 622. The inverter 604 can have one or more indicators that indicate the status of the inverter 604. For example, the inverter 604 can have one or more lights and/or displays that indicate the status of the inverter. In an exemplary embodiment, the lights comprise Light Emitting Diodes (LEDs).

The electrical connection 622 can be coupled to a breaker 612. The inverter 604 can provide power to the breaker 612 via the electrical connection 622. The breaker 612 can be coupled to an electrical connection 624. The electrical connection 624 can be coupled to an electrical connection 626 that is coupled with the variable frequency drive 606, as well coupled to an electrical connection 628 that is coupled to a step-down transformer 616. The step-down transformer 616 can reduce (e.g., step-down) the power provided by the inverter 604 to provide a lower power to one or more devices that require a different voltage than the voltage output by the inverter 604. The step-down transformer 616 is coupled to an electrical connection 630 that is coupled to an output 632. The output 632 can be a control power output. Thus, the output 632 can receive power from the inverter 604 after the inverter 604 has converted the DC power from the battery 602 to AC power, and step-down the received AC power to provide a lower power output on the output 632.

The variable frequency drive 606 receives the AC power from the inverter 604. The variable frequency drive 606 converts the AC power to three-phase AC power. That is, the variable frequency drive 606 receives single phase AC power from the inverter 604, and converts the single phase AC power to three-phase AC power. The variable frequency drive 606 can output the three-phase AC power to the electrical connection 634. The variable frequency drive 606 can provide AC power from 0-480 VAC. Further, the variable frequency drive 606 can be configured to limit inrush current when a load (e.g., an AC load) coupled to the output 640 turns on. The operation of the variable frequency drive 606 can be modified by programming. For example, a ramp rate of the variable frequency drive 606 can be modified, as well as a terminal voltage of the variable frequency drive 606.

The electrical connection 634 can be coupled with a breaker 614. The breaker 614 can be coupled to an electrical connection 636. The electrical connection 636 can be coupled to the reversing contactor 608. The reversing contactor 608 can be configured to modify (e.g., shift) the phase of the power output by the variable frequency drive 606. Specifically, the reversing contactor 608 can shift the power output to ensure the frequency of the three-phase AC power is in the proper phase. The reversing contactor 608 can be coupled with a switch 610 that indicates the phase of the three-phase AC power. A user can manipulate the switch 610 to modify the operating mode of the reversing contactor 608. For example, the switch 610 can have a forward mode and a reverse mode. Flipping the switch 610 between the two modes reverse the direction of the three-phase AC power. For example, flipping the switch 610 can shift the three-phase AC power by 120 degrees. The reversing contactor 608 can provide an output to the electrical connection 638, which is coupled to an output 640. The output 640 can be coupled to a device that operates on three-phase AC power. For example, the output 640 can provide power to a variety of AC powered devices such as any AC load, AC motors, AC motor operated valves, communication equipment, and so forth. While the reversing contactor 608 is illustrated as being separate from the variable frequency drive 606 for ease of explanation, a person of ordinary skill in the art would appreciate that the reversing contactor 608 can be incorporated into the variable frequency drive 606. Stated differently, the variable frequency drive 606 can include the capabilities of the reversing contactor 608. Thus, the variable frequency drive 606 can include the capability to modify the phase of the power output by the variable frequency drive 606.

Further, the apparatus 600 can comprise one or more indicators (not shown). For example, the one or more indicators can indicate the power output of one or more outputs (e.g., the output 632, and/or the output 640). As an example, a first indicator could indicate the AC voltage and/or AC current output by the output 632, and a second indictor could indicate the three-phase AC voltage and/or AC current output by the output 640.

While the electrical connections 620-638 are generally shown as direct connections between the various components of the system 600 for ease of explanation, a person skilled in the art would appreciate that the electrical connections 620-638 can comprise additional components, such as resistors, capacitors, inductors, breakers, switches, and so forth.

Figure 7:
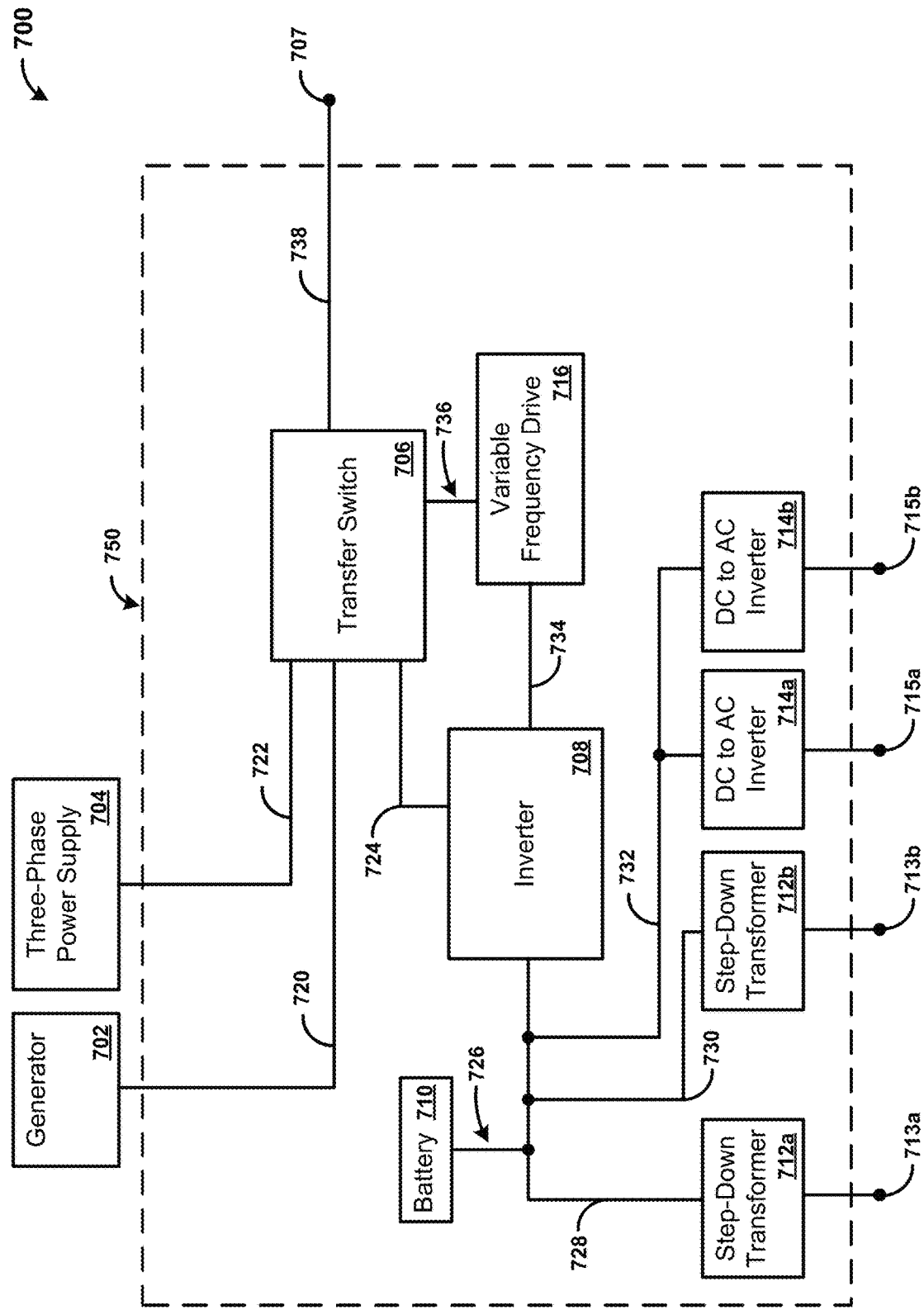
FIG. 7 illustrates an example system for providing power.

FIG. 7 illustrates an exemplary system 700 for providing power. The system 700 has a generator 702, a three-phase power supply 704, a transfer switch 706, an inverter 708, a battery 710, and a variable frequency drive 716. Additionally, the system 700 comprises step-down transformers 712a,b and DC to AC inverters 714a,b. Further, the system 700 comprises an apparatus 750. The apparatus 750 can comprise the transfer switch 706, the inverter 708, the battery 710, the variable frequency drive 716, the step-down transformers 712a,b, and the DC to AC inverters 714a,b. For example, the apparatus 750 can be a single device (e.g., enclosure) that comprises the components of the system 700 except for the generator 702 and the three-phase power supply 704.

The generator 702 can be any generator capable of providing power. For example, the generator 702 can be capable of Alternating Current (AC). The generator 702 can output between 100 VAC and 250 VAC, as well as higher voltages. For example, the generator 702 can output 120 VAC and/or 240 VAC. The generator 702 can provide (e.g., output) power to the transfer switch 706 via an electrical connection 720. For example, the generator 702 can provide AC power to the transfer switch 706 via the electrical connection 720.

The generator 702 can operate on any suitable fuel, such as gasoline, diesel, Liquid Propane Gas (LPG), natural gas, and so forth. The generator 702 can operate on two or more fuels. For example, the generator 702 can be capable of operating on both gasoline and LPG. The generator 702 can be capable of switching between the two fuels either manually or automatically. As an example, the generator 702 can default to running on gasoline stored within a gas tank associated with the generator 702. Once the generator 702 runs out of gasoline within the gas tank, the generator 702 can switch over to the LPG. As another example, the generator 702 can switch between two or more LPG tanks coupled with the generator 702. That is, when a first of the two or more LPG tanks runs out of the LPG, the generator 702 can manually, or automatically, switch to a second of the two or more LPG tanks.

The three-phase power supply 704 can be any suitable three-phase power supply 704. For example, the three-phase power supply 704 can be coupled with a power distribution network that receives power from a power plant. The three-phase power supply 704 can output between 100 VAC and 250 VAC, as well as higher voltages. For example, the three-phase power supply 704 can output 120 VAC and/or 240 VAC. The three-phase power supply 704 can provide (e.g., output) power to the transfer switch 706 via an electrical connection 722. For example, the three-phase power supply 704 can provide AC power to the transfer switch 706 via the electrical connection 722.

The transfer switch 706 can comprise any switch capable of switching between two or more power sources. As shown, the transfer switch 706 can receive power from the generator 702 and/or the three-phase power supply 704. The transfer switch 706 can provide the received power to the inverter 708 via an electrical connection 724. Alternatively, the transfer switch 706 can provide the received power to an output 707 via an electrical connection 738. The transfer switch 706 can comprise an adjustable voltage proving time delay module. The adjustable voltage proving time delay module can be configured to variably set at least one of a voltage delay trigger or a time delay trigger when an AC presence is detected on the electrical connection 720. That is, the adjustable voltage proving time delay module can be configured to set a voltage delay trigger upon receiving power from the generator 702.

Additionally, the transfer switch 706 can receive power from the variable frequency drive 716 via the electrical connection 736. In an exemplary embodiment, the transfer switch 706 can switch between receiving power from the generator 702, the three-phase power supply 704, and the variable frequency drive 716. Stated differently, the transfer switch 706 can auctioneer between the generator 702, the three-phase power supply 704, and the variable frequency drive 716. That is, the transfer switch 706 can automatically switch between the generator 702, the three-phase power supply 704, and the variable frequency drive 716. For example, if the generator 702 runs out of fuel, the transfer switch 706 can switch to receiving power from the variable frequency drive 716. In this manner, the transfer switch 706 can continue to output power to the output 707 via the electrical connection 738 even if one of the power sources of the transfer switch 706 (e.g., generator 702, the three-phase power supply 704, and the variable frequency drive 716) stops providing power to the transfer switch 706.

The inverter 708 can be any device capable of converting AC power to DC power, as well as DC power to AC power. For example, the inverter 708 can be a rectifier. The inverter 708 can receive power from the generator 702 and/or the three-phase power supply 704 via the electrical connection 724. For example, the inverter 708 can receive AC power from the generator 702 and/or the three-phase power supply 704 via the transfer switch 706 by receiving the power via the electrical connection 724. The inverter 708 can convert the received AC power to DC power. The inverter 708 can provide (e.g., output) the DC power to the battery 710 via an electrical connection 726. As an example, the inverter 708 can charge the battery 710 via the electrical connection 726. The inverter 708 can charge the battery 710, while also providing power to one or more additional devices. For example, the inverter 708 can provide power to the step-down transformers 712*a,b* and the DC to AC inverters 714*a,b*, while also charging the battery 710.

Further, the inverter 708 can receive DC power from the battery 710. For example, the inverter 708 can receive 12 VDC 24 VDC, 48 VDC, 72 VDC, as well as voltages ranging from 100 VDC to 800 VDC. The inverter 708 can invert (e.g., convert) the received DC power to AC power. The inverter 708 can output the inverted AC power. For example, the inverter 708 can output 110 VAC, 120 VAC, or any suitable output AC output. The inverter 708 can provide the inverted AC power to the variable frequency drive 716 via an electrical connection 734. For example, the inverter 708 can comprise an internal transfer switch. The internal transfer switch can be capable of auctioneering AC power output to the variable frequency drive 716 between the electrical connection 724 (e.g., that is provided by the transfer switch 706) and the electrical connection 726 (e.g., that is provided by the battery 710). Stated differently, the inverter 708 is capable of switching (e.g., automatically) between power inputs received from the transfer switch 706, via the electrical connection 724, and from the battery 710, via the electrical connection 726, in order to maintain a constant output to the variable frequency device 716 via the electrical connection 734. The inverter 708 can have one or more indicators that indicate the status of the inverter 708. For example, the inverter 708 can have one or more lights and/or displays that indicate the status of the inverter. In an exemplary embodiment, the lights comprise Light Emitting Diodes (LEDs).

The battery 710 can be one or more batteries configured to store power, as well as provide the stored power. The battery 710 can provide DC power. The battery 710 can have an associated voltage, such as a 12 V, 24 V, 48 V, 125 V, 250 V, 400 V, etc. battery. Further, the battery 710 can have an output current. For example, the battery 710 can output 5 A, 50 A, 150 A, 300 A, etc. In an exemplary embodiment, the battery 710 can be a 12 V battery with a rated output of up to 150 A. In another exemplary embodiment, the battery 710 can be a 24 V and/or a 48 V battery with a rated output of up to 300 A. As a further exemplary embodiment, the battery 710 can be a 410 V battery. As will be appreciated by one skilled in the art, the battery 710 can be a battery with any voltage and/or current characteristics.

The battery 710 can be any battery, such as rechargeable batteries or non-rechargeable batteries. The battery 710 can be a Lithium Ion (Li+) battery, a lead acid (Pb) battery, a Lithium Iron Phosphate (LiFePo) battery, or any type of rechargeable battery. The battery 710 can be one or more batteries configured to store power from the inverter 708. For example, the battery 710 can receive power from the inverter 708 via the electrical connection 726 and store the power from the inverter 708. Stated differently, the inverter 708 can charge the battery 710 via the electrical connection 726. Additionally, the battery 710 can provide power to the inverter 708. For example, the battery 710 can discharge (e.g., provide power) to the inverter 708 via the electrical connection 726. Accordingly, the battery 710 is capable of receiving power from the inverter 708, as well as providing power to the inverter 708.

Further, the battery 710 can have an auxiliary output (not shown). The auxiliary output can be capable of receiving and/or providing DC power to another device. For example, an apparatus capable of running on DC power can be coupled to the battery 710 to receive power from the battery 710 via the auxiliary output. As an example, a light can be coupled to the battery 710. As another example, an apparatus capable of providing DC power can be coupled to the battery 710. As an example, a maintenance battery charger can be coupled to the battery 710 via the auxiliary output to charge the battery 710.

The variable frequency drive 716 receives AC power from the inverter 708 via the electrical connection 734. The variable frequency drive 716 converts the AC power to three-phase AC power. That is, the variable frequency drive 716 receives single phase AC power from the inverter 708, and converts the single phase AC power to three-phase AC power. The variable frequency drive 716 can output the three-phase AC power to the transfer switch 706 via an electrical connection 736. The variable frequency drive 716 can provide AC power from 0-480 VAC. The operation of the variable frequency drive 716 can be modified by programming. For example, a ramp rate of the variable frequency drive 716 can be modified, as well as a terminal voltage of the variable frequency drive 716.

The step-down transformers 712a,b can reduce (e.g., step-down) the power provided by the inverter 708 and/or the battery 710 to provide a lower power to one or more devices that require a different voltage than the voltage output by the inverter 708 and/or the battery 710. That is, the step-down transformers 712a,b step-down the voltage provided by the inverter 708 and/or the battery 710 to provide a step-downed voltage to outputs 713a,b. The step-down transformer 712a can receive DC power via the electrical connection 728 and provide the stepped-down voltage to the output 713a. The step-down transformer 712b can receive DC power via the electrical connection 730 and provide the stepped-down voltage to the output 713b. The outputs 713a,b can receive power from the inverter 708 after the inverter 708 has inverted the AC power from the transfer switch 706 to DC power, and step-down the received DC power to provide a lower power output on the outputs 713a,b. Additionally, the outputs 713a,b can receive DC power from the battery 710 and step-down the received DC power to provide a lower power output on the outputs 713a,b. The outputs 713a,b can output voltages of 12 VDC 24 VDC, 48 VDC, 72 VDC, as well as voltages ranging from 100 VDC to 800 VDC. In an exemplary embodiment, one of the outputs 713a,b outputs 125 VDC, while the other output outputs 250 VDC. The step-down transformers 712a,b can have one or more indicators that indicate the status of the step-down transformers 712a,b. For example, the step-down transformers 712a,b can have one or more lights and/or displays that indicate the status of the step-down transformers 712a,b. In an exemplary embodiment, the lights comprise Light Emitting Diodes (LEDs).

The DC to AC inverters 714a,b can receive DC power from the inverter 708 and/or the battery 710. The DC to AC inverters 714a,b can receive DC power from the inverter 708 and/or the battery 710 via an electrical connection 732. For example, the DC to AC inverters 714a,b can receive 12 VDC 24 VDC, 48 VDC, 72 VDC, as well as voltages ranging from 100 VDC to 800 VDC. The DC to AC inverters 714a,b can invert (e.g., convert) the received DC power to AC power. The DC to AC inverters 714a,b can output the inverted AC power. For example, the DC to AC inverters 714a,b can output AC power between 0-800 VAC or any suitable output. In an exemplary embodiment, the DC to AC inverters 714a,b can output between 110-240 VAC. The DC to AC inverter 714a can provide the inverted AC power to a device via an output 715a, and the DC to AC inverter 714b can provide the inverted AC power to a device via an output 715b. The DC to AC inverters 714a,b can have one or more indicators that indicate the status of the DC to AC inverters 714a,b. For example, the DC to AC inverters 714a,b can have one or more lights and/or displays that indicate the status of the DC to AC inverters 714a,b. In an exemplary embodiment, the lights comprise Light Emitting Diodes (LEDs).

While the electrical connections 720-738 are generally shown as direct connections between the various components of the system 700 for ease of explanation, a person skilled in the art would appreciate that the electrical connections 720-738 can comprise additional components, such as resistors, capacitors, inductors, breakers, switches, and so forth.

Figure 8:
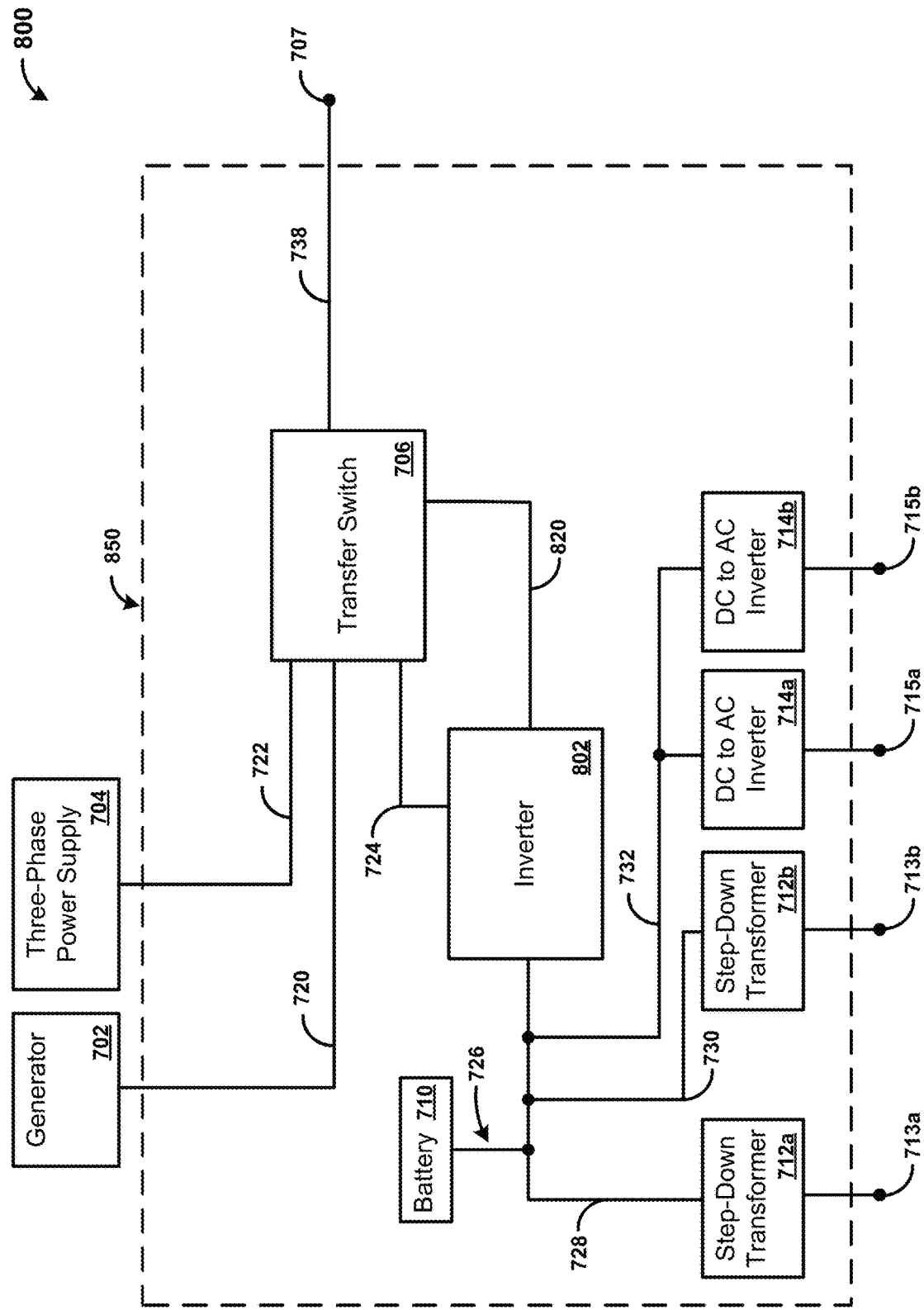
FIG. 8 illustrates an example system for providing power.

FIG. 8 illustrates an exemplary system 800 for providing power. Specifically, as is explained in more detail below, the system 800 is the same as system 700 of FIG. 7 except that the inverter 802 comprises the functionality of the variable frequency drive of 716 of FIG. 7.

The inverter 802 can be any device capable of converting AC power to DC power, as well as DC power to AC power. For example, the inverter 802 can be a rectifier. The inverter 802 can receive power from the generator 702 and/or the three-phase power supply 704 via the electrical connection 724. For example, the inverter 802 can receive AC power from the generator 702 and/or the three-phase power supply 704 via the transfer switch 706 by receiving the power via the electrical connection 724. The inverter 802 can convert the received AC power to DC power. The inverter 802 can provide (e.g., output) the DC power to the battery 710 via an electrical connection 726. As an example, the inverter 802 can charge the battery 710 via the electrical connection 726. The inverter 802 can charge the battery 710, while also providing power to one or more additional devices. For example, the inverter 802 can provide power to the step-down transformers 712a,b and the DC to AC inverters 714a,b, while also charging the battery 710.

Further, the inverter 802 can receive DC power from the battery 710. For example, the inverter 802 can receive 12 VDC 24 VDC, 48 VDC, 72 VDC, as well as voltages ranging from 100 VDC to 800 VDC. The inverter 802 can invert (e.g., convert) the received DC power to AC power. The inverter 802 can output the inverted AC power. The inverter 802 can output the inverted AC power to the transfer switch 706 via an electrical connection 820. For example, the inverter 802 can output 110 VAC, 120 VAC, or any suitable output AC output to the transfer switch 706.

The inverter 802 can comprise an internal transfer switch. The internal transfer switch can be capable of auctioneering AC power output to the transfer switch 806 between the electrical connection 724 (e.g., that is provided by the transfer switch 706) and the electrical connection 726 (e.g., that is provided by the battery 710). Stated differently, the inverter 802 is capable of switching (e.g., automatically) between power inputs received from the transfer switch 706, via the electrical connection 724, and from the battery 710, via the electrical connection 726, in order to maintain a constant output to the transfer switch 706 via the electrical connection 820. The inverter 802 can have one or more indicators that indicate the status of the inverter 802. For example, the inverter 802 can have one or more lights and/or displays that indicate the status of the inverter. In an exemplary embodiment, the lights comprise Light Emitting Diodes (LEDs).

The inverter 802 can be capable of outputting three-phase AC power. That is, the inverter 802 can convert the inverted AC power to three-phase AC power, and output the three-phase AC power to the transfer switch 706 via the electrical connection 820. The inverter 802 can provide three-phase AC power from 0-480 VAC. The operation of the inverter 802 can be modified by programming. For example, a ramp rate of the inverter 802 can be modified, as well as a terminal voltage of the inverter 802.

While the electrical connections 820-836 are generally shown as direct connections between the various components of the system 800 for ease of explanation, a person skilled in the art would appreciate that the electrical connections 820-836 can comprise additional components, such as resistors, capacitors, inductors, breakers, switches, and so forth.

Figure 9:
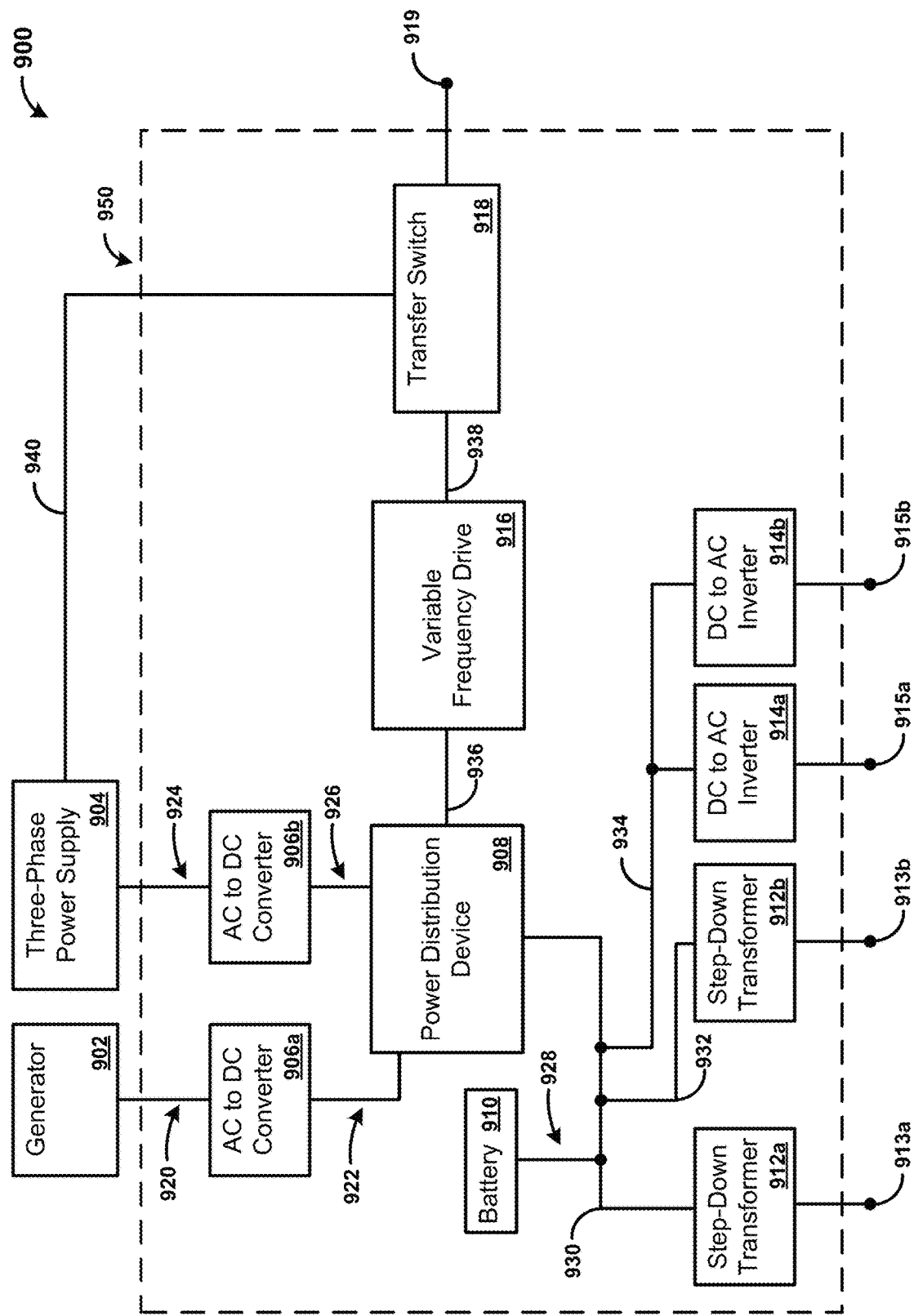
FIG. 9 illustrates an example system for providing power.

FIG. 9 illustrates an exemplary system 900 for providing power. The system 900 has a generator 902, a three-phase power supply 904, AC to DC converters 906a,b, a power distribution device 908, a battery 910, a variable frequency drive 916, and a transfer switch 918. Additionally, the system 900 comprises step-down transformers 912a,b and DC to AC inverters 914a,b. Further, the system 900 comprises an apparatus 950. The apparatus 950 can comprise the AC to DC converters 906a,b, the power distribution device 908, the battery 910, the variable frequency drive 916, the transfer switch 918, the step-down transformers 912a,b, and the DC to AC inverters 914a,b. For example, the apparatus 950 can be a single device (e.g., enclosure) that comprises the components of the system 900 except for the generator 902 and the three-phase power supply 904.

The generator 902 can be any generator capable of providing power. For example, the generator 902 can be capable of producing Alternating Current (AC). The generator 902 can output between 100 VAC and 250 VAC, as well as higher voltages. For example, the generator 902 can output 120 VAC and/or 240 VAC. The generator 902 can provide (e.g., output) power to the AC to DC converter 906a via an electrical connection 920. For example, the generator 902 can provide AC power to the AC to DC converter 906a via the electrical connection 920.

The generator 902 can operate on any suitable fuel, such as gasoline, diesel, Liquid Propane Gas (LPG), natural gas, and so forth. The generator 902 can operate on two or more fuels. For example, the generator 902 can be capable of operating on both gasoline and LPG. The generator 902 can be capable of switching between the two fuels either manually or automatically. As an example, the generator 902 can default to running on gasoline stored within a gas tank associated with the generator 902. Once the generator 902 runs out of gasoline within the gas tank, the generator 902 can switch over to the LPG. As another example, the generator 902 can switch between two or more LPG tanks coupled with the generator 902. That is, when a first of the two or more LPG tanks runs out of the LPG, the generator 902 can manually, or automatically, switch to a second of the two or more LPG tanks.

The three-phase power supply 904 can be any suitable three-phase power supply 904. For example, the three-phase power supply 904 can be coupled with a power distribution network that receives power from a power plant. The three-phase power supply 904 can output between 100 VAC and 480 VAC, as well as higher voltages. For example, the three-phase power supply 904 can output 120 VAC and/or 240 VAC. The three-phase power supply 904 can provide (e.g., output) power to the AC to DC converter 906b via an electrical connection 924. For example, the three-phase power supply 904 can provide AC power to the AC to DC converter 906b via the electrical connection 924.

The AC to DC converters 906a,b can convert AC power to DC power. For example, the AC to DC converters 906a,b can be rectifiers. The AC to DC converters 906a,b can receive power from the generator 902 and/or the three-phase power supply 904 via the electrical connections 920,924. For example, the AC to DC converter 906a can receive AC power from the generator 902, and the AC to DC converter 906b can receive AC power from the three-phase power supply 904. Specifically, the AC to DC converter 906a can receive AC power from the generator 902 via the electrical connection 920, and the AC to DC converter 906b can receive AC power from the three-phase power supply 904 via the electrical connection 924. The AC to DC converters 906a,b can convert the received AC power to DC power. The AC to DC converters 906a,b can provide (e.g., output) the DC power to the power distribution device 908. Specifically, the AC to DC converter 906a can provide AC power to the power distribution device 908 via the electrical connection 922, and the AC to DC converter 906b can provide AC power to the power distribution device 908 via the electrical connection 926.

The power distribution device 908 can be any device capable of distributing power. Specifically, the power distribution device 908 can be configured to receive power from the AC to DC converters 906a,b and to provide the received power to the battery 910, the step-down transformers 912a,b, the DC to AC inverters 914a,b, and/or the variable frequency drive 916. The power distribution device 908 can receive power from the generator 902 and/or the three-phase power supply 904 via the AC to DC converters 906a,b. The power distribution device 908 can receive 12 VDC 24 VDC, 48 VDC, 72 VDC, as well as voltages ranging from 100 VDC to 800 VDC. For example, the power distribution device 908 can receive DC power from the AC to DC converter 906a via the electrical connection 922, as well as receive DC power from the AC to DC converter 906b via the electrical connection 926. The power distribution device 908 can provide (e.g., output) the DC power to the battery 910 via an electrical connection 928. As an example, the power distribution device 908 can charge the battery 910 via the electrical connection 928. The power distribution device 908 can charge the battery 910, while also providing power to one or more additional devices. For example, the power distribution device 908 can provide power to the step-down transformers 912a,b and the DC to AC inverters 914a,b, while also charging the battery 910.

Further, the power distribution device 908 can receive DC power from the battery 910. For example, the power distribution device 908 can receive 12 VDC 24 VDC, 48 VDC, 72 VDC, as well as voltages ranging from 100 VDC to 800 VDC. The power distribution device 908 can invert (e.g., convert) the received DC power to AC power. That is, the power distribution device 908 can invert the DC power received from the battery 910, as well as the AC to DC converters 906*a,b*. The power distribution device 908 can output the inverted AC power. For example, the power distribution device 908 can output AC power between 0-800 VAC or any suitable output. In an exemplary embodiment, the power distribution device 908 can output between 110-240 VAC. The power distribution device 908 can provide the inverted AC power to the variable frequency drive 916 via an electrical connection 936. The power distribution device 908 can comprise an internal transfer switch. The internal transfer switch can be capable of auctioneering DC power that is received from the electrical connection 922 (e.g., that is provided by the AC to DC converter 906*a*), the electrical connection 926 (e.g., that is provided by the AC to DC converter 906*b*), and the electrical connection 928 (e.g., that is provided by the battery 910). Stated differently, the power distribution device 908 is capable of switching (e.g., automatically) between power inputs received from the AC to DC converter 906*a*, via the electrical connection 922; from the AC to DC converter 906*b*, via the electrical connection 926; and from the battery 910, via the electrical connection 928, in order to maintain a constant output to the variable frequency device 916 via the electrical connection 936. The power distribution device 908 can have one or more indicators that indicate the status of the power distribution device 908. For example, the power distribution device 908 can have one or more lights and/or displays that indicate the status of the inverter. In an exemplary embodiment, the lights comprise Light Emitting Diodes (LEDs).

The variable frequency drive 916 receives AC power from the power distribution device 908 via the electrical connection 936. The variable frequency drive 916 converts the AC power to three-phase AC power. That is, the variable frequency drive 916 receives single phase AC power from the power distribution device 908, and converts the single phase AC power to three-phase AC power. The variable frequency drive 916 can output the three-phase AC power to the transfer switch 906 via an electrical connection 938. The variable frequency drive 916 can provide AC power from 0-480 VAC. The operation of the variable frequency drive 916 can be modified by programming. For example, a ramp rate of the variable frequency drive 916 can be modified, as well as a terminal voltage of the variable frequency drive 916.

The transfer switch 918 can comprise any switch capable of switching between two or more power sources. As shown, the transfer switch 918 can receive power from the variable frequency drive 916, as well as the three-phase power supply 904. Specifically, the transfer switch 918 receives three-phase AC power from the variable frequency drive 916 via the electrical connection 938, and the transfer switch 918 receives three-phase AC power from the three-phase power supply 904 via the electrical connection 940. The transfer switch 918 can output the received power. Specifically, the transfer switch 918 can output the receive power to an output 919.

Additionally, the transfer switch 918 can switch between receiving power from the three-phase power supply 904, and the variable frequency drive 916. Stated differently, the transfer switch 918 can auctioneer between the three-phase power supply 904 and the variable frequency drive 916. That is, the transfer switch 918 can automatically switch between receiving power from the three-phase power supply 904 and the variable frequency drive 916. For example, if the three-phase power supply 904 is unable to provide power, the transfer switch 918 can switch to receiving power from the variable frequency drive 916. In this manner, the transfer switch 918 can continue to output power to the output 919 even if one of the power sources of the transfer switch 916 (e.g., the three-phase power supply 904, or the variable frequency drive 916) stops providing power to the transfer switch 918.

The battery 910 can be one or more batteries configured to store power, as well as provide the stored power. The battery 910 can provide DC power. The battery 910 can have an associated voltage, such as a 12 V, 24 V, 48 V, 125 V, 250 V, 400 V, etc. battery. Further, the battery 910 can have an output current. For example, the battery 910 can output 5 A, 50 A, 150 A, 300 A, etc. In an exemplary embodiment, the battery 910 can be a 12 V battery with a rated output of up to 150 A. In another exemplary embodiment, the battery 910 can be a 24 V and/or a 48 V battery with a rated output of up to 300 A. As a further exemplary embodiment, the battery 910 can be a 410 V battery. As will be appreciated by one skilled in the art, the battery 910 can be a battery with any voltage and/or current characteristics.

The battery 910 can be any battery, such as rechargeable batteries or non-rechargeable batteries. The battery 910 can be a Lithium Ion (Li+) battery, a lead acid (Pb) battery, a Lithium Iron Phosphate (LiFePo) battery, or any type of rechargeable battery. The battery 910 can be one or more batteries configured to store power from the power distribution device 908. For example, the battery 910 can receive power from the power distribution device 908 via the electrical connection 928 and store the power from the power distribution device 908. Stated differently, the power distribution device 908 can charge the battery 910 via the electrical connection 928. Additionally, the battery 910 can provide power to the power distribution device 908. For example, the battery 910 can discharge (e.g., provide power) to the power distribution device 908 via the electrical connection 928. Accordingly, the battery 910 is capable of receiving power from the power distribution device 908, as well as providing power to the power distribution device 908.

Further, the battery 910 can have an auxiliary output (not shown). The auxiliary output can be capable of receiving and/or providing DC power to another device. For example, an apparatus capable of running on DC power can be coupled to the battery 910 to receive power from the battery 910 via the auxiliary output. As an example, a light can be coupled to the battery 910. As another example, an apparatus capable of providing DC power can be coupled to the battery 910. As an example, a maintenance battery charger can be coupled to the battery 910 via the auxiliary output to charge the battery 910.

The step-down transformers 912*a,b* can reduce (e.g., step-down) the power provided by the power distribution device 908 and/or the battery 910 to provide a lower power to one or more devices that require a different voltage than the voltage output by the power distribution device 908 and/or the battery 910. That is, the step-down transformers 912*a,b* step-down the voltage provided by the power distribution device 908 and/or the battery 910 to provide a step-downed voltage to outputs 913*a,b*. The step-down transformer 912*a* can receive DC power via the electrical connection 930 and provide the stepped-down voltage to the output 913*a*. The step-down transformer 912*b* can receive DC power via the electrical connection 932 and provide the stepped-down voltage to the output 913*b*. The outputs 913*a,b* can receive power from the power distribution device 908, and step-down the received DC power to provide a lower power output on the outputs 913*a,b*. Additionally, the outputs 913*a,b* can receive DC power from the battery 910 and step-down the received DC power to provide a lower power output on the outputs 913*a,b*. The outputs 913*a,b* can output voltages of 12 VDC 24 VDC, 48 VDC, 72 VDC, as well as voltages ranging from 100 VDC to 800 VDC. In an exemplary embodiment, one of the outputs 913*a,b* outputs 125 VDC, while the other output outputs 250 VDC. The step-down transformers 912*a,b* can have one or more indicators that indicate the status of the step-down transformers 912*a,b*. For example, the step-down transformers 912*a,b* can have one or more lights and/or displays that indicate the status of the step-down transformers 912*a,b*. In an exemplary embodiment, the lights comprise Light Emitting Diodes (LEDs).

The DC to AC inverters 914*a,b* can receive DC power from the power distribution device 908 and/or the battery 910. The DC to AC inverters 914*a,b* can receive DC power from the power distribution device 908 and/or the battery 910 via an electrical connection 934. For example, the DC to AC inverters 914*a,b* can receive 12 VDC 24 VDC, 48 VDC, 72 VDC, as well as voltages ranging from 100 VDC to 800 VDC. The DC to AC inverters 914*a,b* can invert (e.g., convert) the received DC power to AC power. The DC to AC inverters 914*a,b* can output the inverted AC power. For example, the DC to AC inverters 914*a,b* can output the inverted AC power. For example, the DC to AC inverters 914*a,b* can output AC power between 0-800 VAC or any suitable output. In an exemplary embodiment, the power distribution device 908 can output between 110-240 VAC. The DC to AC inverter 914*a* can provide the inverted AC power to a device via an output 915*a*, and the DC to AC inverter 914*b* can provide the inverted AC power to a device via an output 915*b*. The DC to AC inverters 914*a,b* can have one or more indicators that indicate the status of the DC to AC inverters 914*a,b*. For example, the DC to AC inverters 914*a,b* can have one or more lights and/or displays that indicate the status of the DC to AC inverters 914*a,b*. In an exemplary embodiment, the lights comprise Light Emitting Diodes (LEDs).

While the electrical connections 920-940 are generally shown as direct connections between the various components of the system 900 for ease of explanation, a person skilled in the art would appreciate that the electrical connections 920-940 can comprise additional components, such as resistors, capacitors, inductors, breakers, switches, and so forth.

Figure 10:
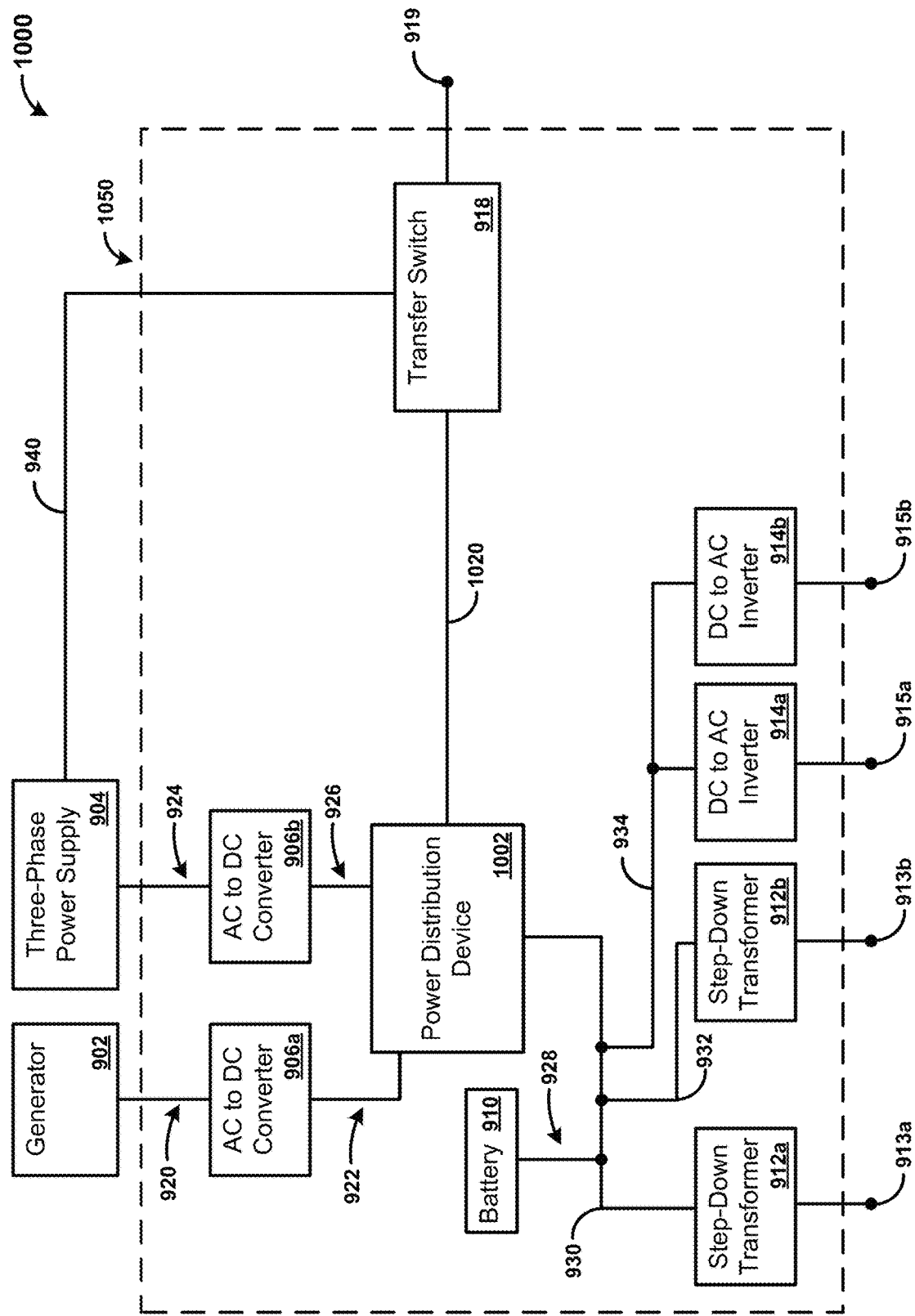
FIG. 10 illustrates an example system for providing power.

FIG. 10 illustrates an exemplary system 1000 for providing power. Specifically, as is explained in more detail below, the system 1000 is the same as system 900 of FIG. 9 except that the power distribution device 1002 comprises the functionality of the variable frequency drive of 916 of FIG. 9.

The power distribution device 1002 can be any device capable of distributing power. Specifically, the power distribution device 1002 can be configured to receive power from the AC to DC converters 906*a,b* and to provide the received power to the battery 910, the step-down transformers 912*a,b*, the DC to AC inverters 914*a,b*, and/or the variable frequency drive 916. The power distribution device 1002 can receive power from the generator 902 and/or the three-phase power supply 904 via the AC to DC converters 906*a,b*. The power distribution device 1002 can receive 12 VDC 24 VDC, 48 VDC, 72 VDC, as well as voltages ranging from 100 VDC to 800 VDC. For example, the power distribution device 1002 can receive DC power from the AC to DC converter 906*a* via the electrical connection 922, as well as receive DC power from the AC to DC converter 906*b* via the electrical connection 926. The power distribution device 1002 can provide (e.g., output) the DC power to the battery 910 via an electrical connection 928. As an example, the power distribution device 1002 can charge the battery 910 via the electrical connection 928. The power distribution device 1002 can charge the battery 910, while also providing power to one or more additional devices. For example, the power distribution device 1002 can provide power to the step-down transformers 912*a,b* and the DC to AC inverters 914*a,b*, while also charging the battery 910.

Further, the power distribution device 1002 can receive DC power from the battery 910. For example, the power distribution device 1002 can receive 12 VDC 24 VDC, 48 VDC, 72 VDC, as well as voltages ranging from 100 VDC to 800 VDC. The power distribution device 1002 can invert (e.g., convert) the received DC power to AC power. That is, the power distribution device 1002 can invert the DC power received from the battery 910, as well as the AC to DC converters 906*a,b*. The power distribution device 1002 can output the inverted AC power. For example, the power distribution device 1002 can output 110 VAC, 120 VAC, or any suitable output AC output. The power distribution device 1002 can provide the inverted AC power to the transfer switch 1016 via an electrical connection 1020. The power distribution device 1002 can comprise an internal transfer switch. The internal transfer switch can be capable of auctioneering DC power that is received from the electrical connection 922 (e.g., that is provided by the AC to DC converter 906*a*), the electrical connection 926 (e.g., that is provided by the AC to DC converter 906*b*), and the electrical connection 928 (e.g., that is provided by the battery 910). Stated differently, the power distribution device 908 is capable of switching (e.g., automatically) between power inputs received from the AC to DC converter 906*a*, via the electrical connection 922; from the AC to DC converter 906*b*, via the electrical connection 926; and from the battery 910, via the electrical connection 928, in order to maintain a constant output to the transfer switch 1016 via an electrical connection 1020. The power distribution device 1002 can have one or more indicators that indicate the status of the power distribution device 1002. For example, the power distribution device 1002 can have one or more lights and/or displays that indicate the status of the inverter. In an exemplary embodiment, the lights comprise Light Emitting Diodes (LEDs).

The power distribution device 1002 can be capable of outputting three-phase AC power. That is, the power distribution device 1002 can invert the received DC power to AC and convert the inverted AC power to three-phase AC power, and output the three-phase AC power to the transfer switch 1016 via the electrical connection 1020. The power distribution device 1002 can provide three-phase AC power from 0-480 VAC. The operation of the power distribution device 1002 can be modified by programming. For example, a ramp rate of the power distribution device 1002 can be modified, as well as a terminal voltage of the power distribution device 1002.

While the electrical connections 920, 922, 924, 926, 928, 930, 932, 934, 1020 are generally shown as direct connections between the various components of the system 1000 for ease of explanation, a person skilled in the art would appreciate that the electrical connections 920, 922, 924, 926, 928, 930, 932, 934, 1020 can comprise additional components, such as resistors, capacitors, inductors, breakers, switches, and so forth.

Figure 11A:
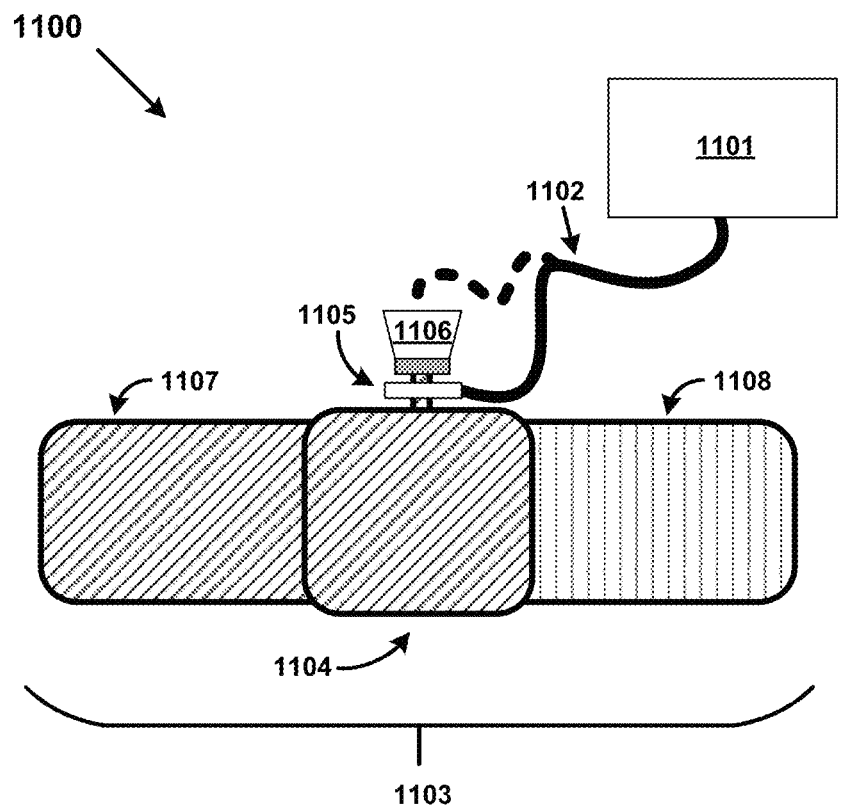
FIGS. 11A-B illustrate an example system for transferring power.

FIG. 11A illustrates an example system 1100 for transferring power. The system may include a power distribution module 1101. The power distribution module may include one or more systems and/or devices for providing power, such as the systems 100-1000 described herein. Power generated/produced by the power distribution module 1101 may be provided to (injected into) a load, such as one or more critical systems, power consuming components, and/or devices of a nuclear power plant, an industrial plant/facility, and/or the like.

To transfer power generated/produced by the power distribution module 1101, a connector 1102 (e.g., a wire, etc.) may be electrically coupled and/or connected between an output of the power distribution module 1101 and a power transfer device 1103. The power transfer device 1103 may include a conductive base 1104. The conductive base 1104 may include (be constructed/machined with) an electrically conductive material. For example, the electrically conductive material may include a metal material such as silver, copper, gold, and/or any other electrically conductive metal/material.

The conductive base 1104 may include an attachment element 1105 and/or an attachment element 1106. The conductive base 1104 may include any number of attachment elements. The attachment elements (e.g., the attachment element 1105, the attachment element 1106, etc.) may enable an electrical connector (e.g., the connector 1102, a wire, etc.), connected to the output of the power distribution module 1101 to transfer power (conduct electricity, transfer current, etc.) to the power transfer device 1103. For example, the connector 1102 may be connected to the attachment element 1105 (as shown) and/or connected to the attachment element 1106 (as shown by the dashed connection). The conductive base 1104 may include any type of attachment elements. For example, the attachment element 1105 may include a post direct post connector type attachment, and the attachment element 1106 may include a banana jack.

The power transfer device 1103 may include a conductive member 1107 extending from and connected to (e.g., electrically coupled to, etc.) a side of the conductive base 1104. The conductive member 1107 may include (be constructed/machined with) an electrically conductive material. For example, the electrically conductive material may include a metal material such as silver, copper, gold, and/or any other electrically conductive metal/material. The conductive member 1107 may transfer power from the conductive base 1104 to the load (not shown).

The power transfer device 1103 may include a non-conductive member 1108 (electricity/power insulating member) extending from an opposite side of the conductive base 1104. The non-conductive member 1108 may include (be constructed/machined with) an electrically non-conductive material. For example, the electrically non-conductive material may include a fiberglass-epoxy laminate (e.g., Garolite, etc.), and/or any other non-conductive material. The non-conductive member 1108 may prevent, block, and/or the like power transferred to the power transfer device 1103 from backfeeding to a source, such as the power distribution module 1101.

In some instances, the power transfer device 1103 may be configured (e.g., machined, constructed, etc.) in a shape, such as a cylindrical shape, a cartridge fuse shape, a power distribution fuse shape, and/or the like. One or more dimensions associated with the conductive member 1107 and one or more dimensions associated with the non-conductive member 1108 may correspond to one or more dimensions associated with one or more fuse holders of an industrial fuse block, such as an industrial fuse block used to distribute power to one or more critical systems, power consuming components, and/or devices of a nuclear power plant, an industrial plant/facility, and/or the like. The power transfer device 1103 may include dimensions that enable the power transfer device 1103 to securely fit in one or more industrial fuse boxes and/or fuse holders. For example, the power transfer device 1103 may include dimensions associated with a fuse type of Underwriters Laboratories (UL) Class CC, UL Class CD, UL Class J, UL Class UL Class R, UL Class G, or UL Class T. The power transfer device 1103 may include dimensions associated with any fuse type. For example, FIG. 11C illustrates an embodiment of the power transfer device 1103 with shape/dimensions associated with a blade fuse type.

Figure 11B:
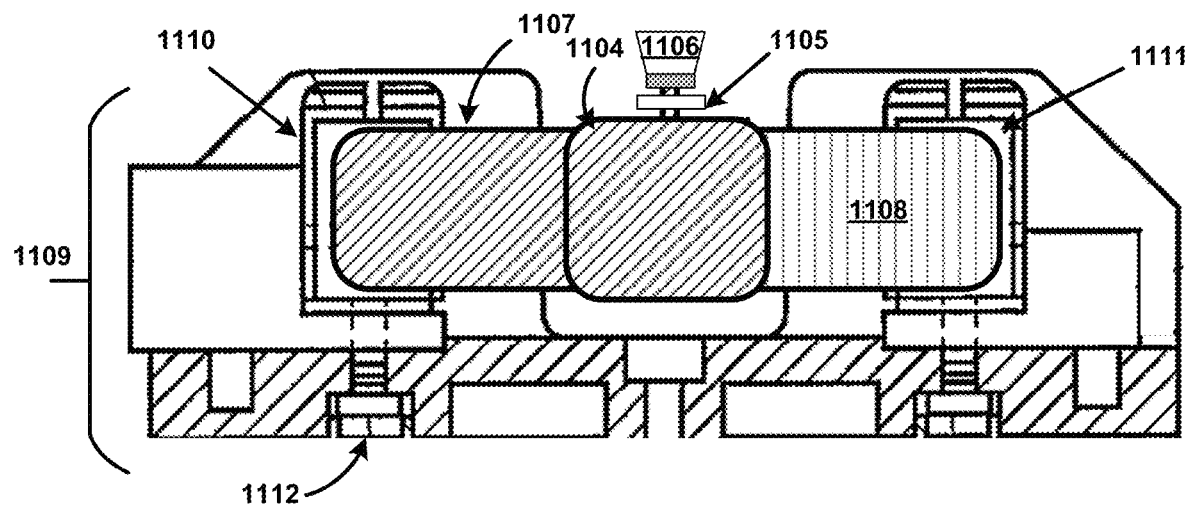
Figure 11C:
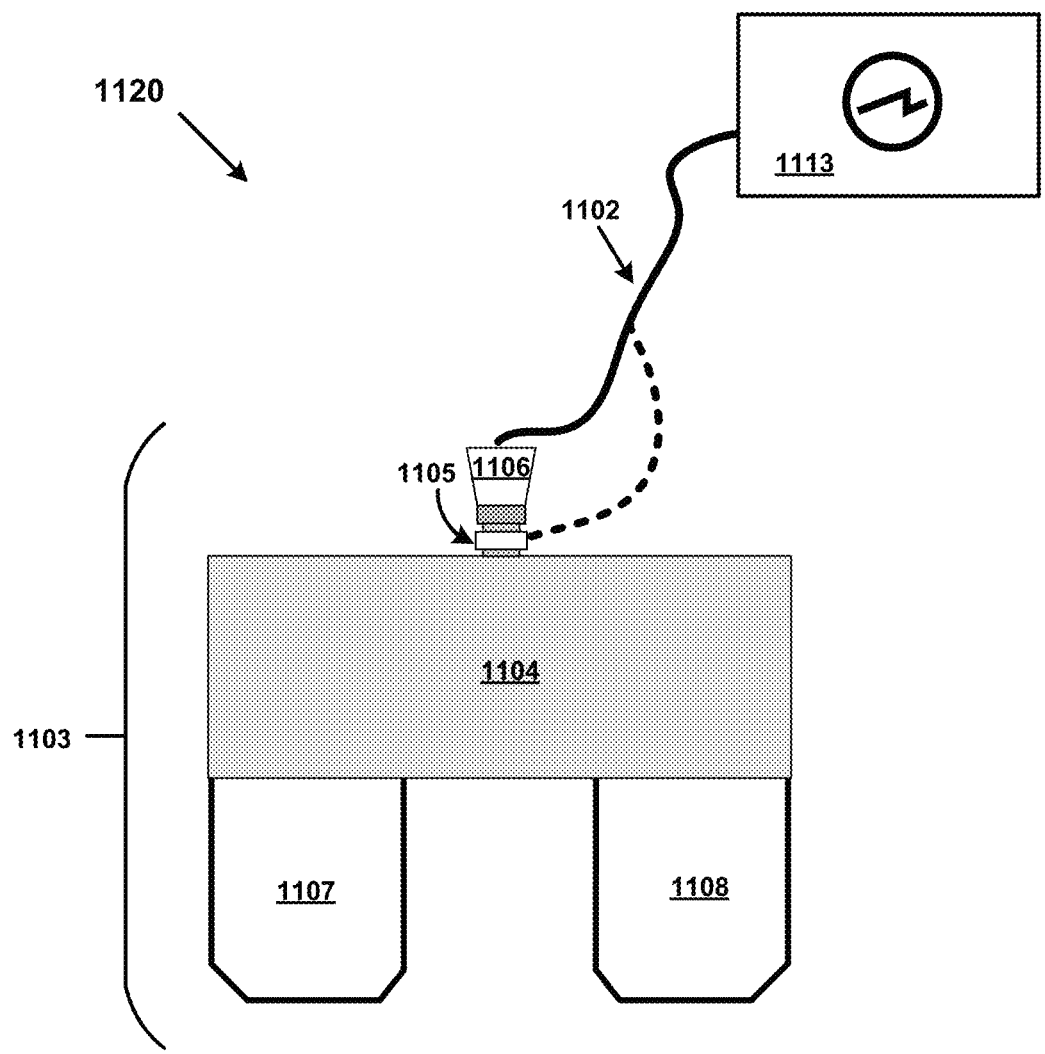
FIG. 11C illustrates an example system for analysis.

FIG. 11B illustrates the power transfer device 1103 positioned in a fuse holder of an industrial fuse box 1109. The conductive member 1107 may attach to a conductive contact 1110 of the industrial fuse box 1109, and the non-conductive member 1108 may attach to a conductive contact 1111 of the industrial fuse box 1109. Power transferred to the power transfer device 1103 (via the attachment elements 1105 and 1106, the conductive base 1104, and the conductive member 1107) may be provided to the load via an electrical connector 1112 extending from the conductive contact 1110. The non-conductive member 1108 may prevent, block, and/or the like power transferred to the power transfer device 1103 from being backfeed to the source (the power distribution module 1101), and may isolate/prevent the power from being transferred to the conductive contact 1111 of the industrial fuse box 1109. The conductive contact 1111 may be, for example, connected to (electrically coupled to) a disabled/failed power source, such as a power source that routinely provided power to the load.

In some instances, the power transfer device 1103 may be used for testing, measurement, and/or analysis, such as voltage measurements, power measurements, frequency analysis, system/component impedance testing, and/or the like. For example, the power distribution module 1101 may be disconnected from the power transfer device 1103 and the power transfer device 1103 may be electrically coupled and/or connected between an output of a testing, measurement, and/or analysis device and/or component, such as a multimeter, an oscilloscope, a diagnostic device, and/or the like. FIG. 11C illustrates an example system 1120 for analysis. FIG. 11C illustrates an embodiment of the power transfer device 1103 with shape/dimensions associated with a blade fuse type and electrically coupled and/or connected, via the connector 1102, to a diagnostic device 1113. The connector 1102 may be connected to the attachment element 1106 (as shown) and/or connected to the attachment element 1105 (as shown by the dashed connection). The diagnostic device 1113 may include a multimeter, an oscilloscope, and/or the like. The diagnostic device 1113 may perform testing, measurement, and/or analysis via one or more signals transferred via the power transfer device 1103 (e.g., the conductive base 1104, the conductive member 1107, etc.). The diagnostic device 1113 may perform testing, measurement, and/or analysis on any component, device and/or the like electrically coupled and/or connected to the conductive member 1107, such as a component, device and/or the like electrically coupled and/or connected to the electrical connector 1112 extending from the conductive contact 1110 in FIG. 11B.

Figure 12:
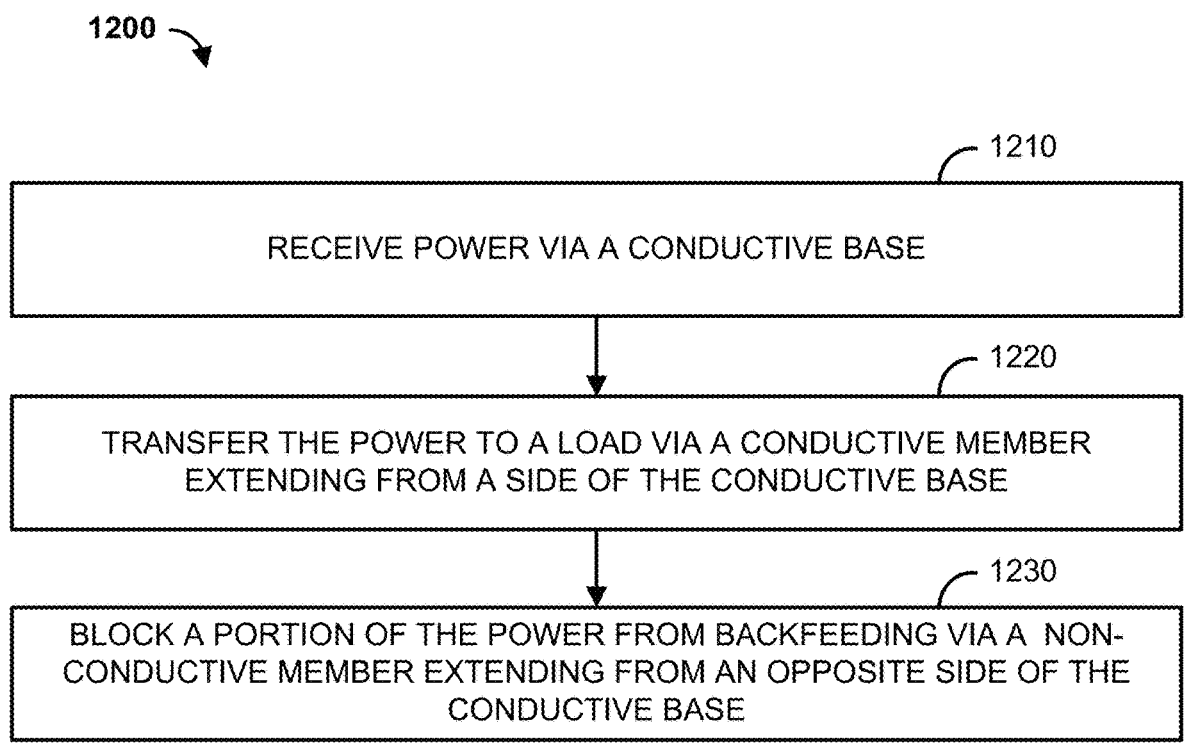
FIG. 12 illustrates a flowchart of an example system for transferring power.

In an embodiment, illustrated in FIG. 12, the system 1100 (e.g., the power transfer device 1103, etc.) may be configured to perform a method 1200 for providing power comprising, at 1210, receiving, via a conductive base comprising one or more attachment elements, power. The conductive base may include one or more conductive materials, such as silver, copper, or gold. The one or more attachment elements may include a banana jack, a direct post connector, or any other electrical connector component/element. The power may be received from a source, such a power distribution system/device (e.g., the systems 100-1000, etc.). The power may include AC power and/or DC power.

At 1220, transferring via a conductive member extending from a side of the conductive base, the power to a load. The load may include one or more critical systems, power consuming components, and/or devices of a nuclear power plant, an industrial plant/facility, and/or the like. The conductive member may include one or more conductive materials, such as silver, copper, or gold.

At 1230, blocking, via a non-conductive member extending from an opposite side of the conductive base, at least a portion of the power from backfeeding to one or more of a source or a device/component, such as a disabled/fails power source. The non-conductive member may include one or more non-conductive materials, such as a fiberglass-epoxy laminate (e.g., Garolite, etc.), and/or the like. In some instances, one or more dimensions associated with the conductive member and one or more dimensions associated with the non-conductive member may correspond to one or more dimensions associated with one or more fuse holders of an industrial fuse block. For example, the conductive base, the conductive member, and the nonconductive member may form a shape, such as a shape of a blade type fuse and/or a cartridge fuse (e.g., a fuses belonging to UL classes CC, CD, J, R, G, T, etc.). The conductive base, the conductive member, and the nonconductive member may form any shape, such as any shape that is complementary to a fuse holder, fuse block, and/or the like.

Figure 13:
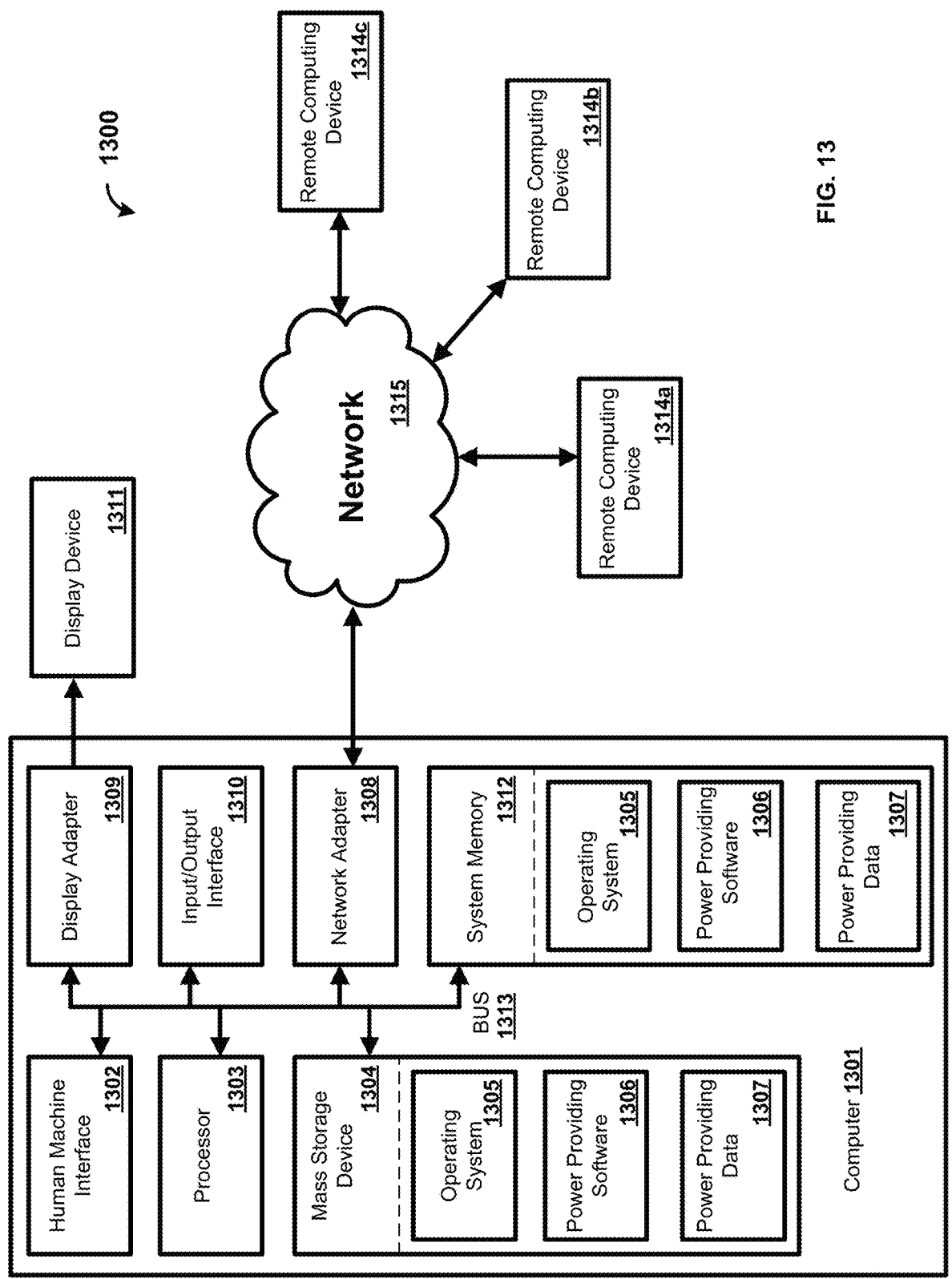
FIG. 13 illustrates a block diagram of an example computing device for providing power.

FIG. 13 shows an exemplary system 1300. The control module 102, the transfer switch 106, and/or the inverter 108 of FIG. 1; the inverter 204 and/or the distribution hub 208 of FIG. 2; the control module 304 of FIG. 3; the control module 402 of FIG. 4; and/or the control module 502 of FIG. 5; the inverter 604 and/or the variable frequency drive 606 of FIG. 6; the inverter 708, the transfer 706, and/or the variable frequency drive 716 of FIG. 7; the inverter 802 of FIG. 8; the power distribution device 908, the variable frequency drive 916, and/or the transfer switch 918 of FIG. 9; and/or the power distribution device 1002 of FIG. 10 may be a computer 1301 as shown in FIG. 13 or can be controlled by the computer 1301.

The computer 1301 may comprise one or more processors 1303, a system memory 1312, and a bus 1313 that couples various system components including the one or more processors 1303 to the system memory 1312. In the case of multiple processors 1303, the computer 1301 may utilize parallel computing. The bus 1313 is one or more of several possible types of bus structures, including a memory bus or memory controller, a peripheral bus, an accelerated graphics port, or local bus using any of a variety of bus architectures.

The computer 1301 may operate on and/or comprise a variety of computer readable media (e.g., non-transitory). The readable media may be any available media that is accessible by the computer 1301 and may include both volatile and non-volatile media, removable and non-removable media. The system memory 1312 has computer readable media in the form of volatile memory, such as random access memory (RAM), and/or non-volatile memory, such as read only memory (ROM). The system memory 1312 may store data such as the power data 1307 and/or program modules such as the operating system 1305 and the power software 1306 that are accessible to and/or are operated on by the one or more processors 1303.

The computer 1301 may also have other removable/non-removable, volatile/non-volatile computer storage media. FIG. 13 shows the mass storage device 1304 which may provide non-volatile storage of computer code, computer readable instructions, data structures, program modules, and other data for the computer 1301. The mass storage device 1304 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Any quantity of program modules may be stored on the mass storage device 1304, such as the operating system 1305 and the power software 1306. Each of the operating system 1305 and the power software 1306 (or some combination thereof) may have elements of the program modules and the power software 1306. The power data 1307 may also be stored on the mass storage device 1304. The power data 1307 may be stored in any of one or more databases known in the art. Such databases may be DB2®, Microsoft® Access, Microsoft® SQL Server, Oracle®, MySQL, PostgreSQL, and the like. The databases may be centralized or distributed across locations within the network 1315.

A user may enter commands and information into the computer 1301 via an input device (not shown). Examples of such input devices comprise, but are not limited to, a keyboard, pointing device (e.g., a computer mouse, remote control), a microphone, a joystick, a scanner, tactile input devices such as gloves, and other body coverings, motion sensor, and the like These and other input devices may be connected to the one or more processors 1303 via a human machine interface 1302 that is coupled to the bus 1313, but may be connected by other interface and bus structures, such as a parallel port, game port, an IEEE 1394 Port (also known as a Firewire port), a serial port, network adapter 1308, and/or a universal serial bus (USB).

The display device 1311 may also be connected to the bus 1313 via an interface, such as the display adapter 1309. It is contemplated that the computer 1301 may have more than one display adapter 1309 and the computer 1301 may have more than one display device 1311. The display device 1311 may be a monitor, an LCD (Liquid Crystal Display), light emitting diode (LED) display, television, smart lens, smart glass, and/or a projector. In addition to the display device 1311, other output peripheral devices may be components such as speakers (not shown) and a printer (not shown) which may be connected to the computer 1301 via the Input/Output Interface 1310. Any step and/or result of the methods may be output (or caused to be output) in any form to an output device. Such output may be any form of visual representation, including, but not limited to, textual, graphical, animation, audio, tactile, and the like. The display device 1311 and computer 1301 may be part of one device, or separate devices.

The computer 1301 may operate in a networked environment using logical connections to one or more remote computing devices 1314*a,b,c*. A remote computing device may be a personal computer, computing station (e.g., workstation), portable computer (e.g., laptop, mobile phone, tablet device), smart device (e.g., smartphone, smart watch, activity tracker, smart apparel, smart accessory), security and/or monitoring device, a server, a router, a network computer, a peer device, edge device, and so on. Logical connections between the computer 1301 and a remote computing device 1314*a,b,c* may be made via a network 1315, such as a local area network (LAN) and/or a general wide area network (WAN). The network 1315 may utilize one or more communication protocols such as Wi-Fi, Bluetooth, or may be cellular network (e.g., a Long Term Evolution (LTE) network, a 4G network, a 5G network, etc.). Such network connections may be through the network adapter 1308. The network adapter 1308 may be implemented in both wired and wireless environments. Such networking environments are conventional and commonplace in dwellings, offices, enterprise-wide computer networks, intranets, and the Internet.

Application programs and other executable program components such as the operating system 1305 are shown herein as discrete blocks, although it is recognized that such programs and components reside at various times in different storage components of the computing device 1301, and are executed by the one or more processors 1303 of the computer. An implementation of the power software 1306 may be stored on or sent across some form of computer readable media. Any of the described methods may be performed by processor-executable instructions embodied on computer readable media.

While specific configurations have been described, it is not intended that the scope be limited to the particular configurations set forth, as the configurations herein are intended in all respects to be possible configurations rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of configurations described in the specification.

In view of the described apparatuses, systems, and methods and variations thereof, herein below are described certain more particularly described embodiments of the invention. These particularly recited embodiments should not however be interpreted to have any limiting effect on any different claims containing different or more general teachings described herein, or that the "particular" embodiments are somehow limited in some way other than the inherent meanings of the language literally used therein.

Embodiment 1: A method comprising: receiving, via a conductive base comprising one or more attachment elements, power transferring via a conductive member extending from a side of the conductive base, the power to a load, and blocking, via a non-conductive member extending from an opposite side of the conductive base, at least a portion of the power from backfeeding to one or more of a source or a device.

Embodiment 2: The embodiment as in any one of the preceding embodiments wherein the conductive base and the conductive member comprise one or more of silver, copper, or gold, wherein the non-conductive member comprises a fiberglass-epoxy laminate.

Embodiment 3: The embodiment as in any one of the preceding embodiments wherein the one or more attachment elements comprise one or more of a banana jack or a direct post connector.

Embodiment 4: The embodiment as in any one of the preceding embodiments receiving the power comprises receiving the power from the source.

Embodiment 5: The embodiment as in any one of the preceding embodiments wherein the source comprises a power distribution device.

Embodiment 6: The embodiment as in any one of the preceding embodiments wherein the power comprises AC power or DC power.

Embodiment 7: The embodiment as in any one of the preceding embodiments wherein one or more dimensions associated with the conductive member and one or more dimensions associated with the non-conductive member correspond to one or more dimensions associated with one or more fuse holders of an industrial fuse block.

Embodiment 8: The embodiment as in the embodiment 7 wherein the one or more dimensions associated with the conductive member and the one or more dimensions associated with the non-conductive member correspond to one or more dimensions associated with distal ends of a power distribution fuse.

Embodiment 9: The embodiment as in the embodiment 8 wherein the power distribution fuse comprises a cartridge fuse.

Embodiment 10: The embodiment as in the embodiment 8 wherein the power distribution fuse comprises a fuse type of Underwriters Laboratories (UL) Class CC, UL Class CD, UL Class J, UL Class UL Class R, UL Class G, or UL Class T.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow;

plain meaning derived from grammatical organization or punctuation; the number or type of embodiments described in the specification.

It will be apparent to those skilled in the art that various modifications and variations may be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

The invention claimed is:

1. An apparatus, comprising:
   a conductive base comprising a first attachment elements configured to receive power from a first power source via a direct post connector and a second attachment element configured to receive the power from the first power source via a banana jack, wherein the first attachment element is configured to extend from a side of the conductive base and the second attachment element is configured to extend from a side of the first attachment element opposite of the conductive base;
   a conductive member extending from a side of the conductive base perpendicular from the first attachment element, wherein the conductive member is configured to transfer the power to a load; and
   a non-conductive member extending from an opposite side of the conductive base from the conductive member, wherein the non-conductive member is configured to prevent backfeed of the power to one or more of a second power source or a device.

2. The apparatus of claim 1, wherein the non-conductive member comprises a fiberglass-epoxy laminate.

3. The apparatus of claim 1, wherein the conductive base and the conductive member each comprise one or more of silver, copper, or gold.

4. The apparatus of claim 1, wherein the load comprises one or more of power consuming components or devices of a power generation system.

5. The apparatus of claim 1, wherein the first power source comprises a power distribution device.

6. The apparatus of claim 1, wherein the power comprises AC power or a DC power.

7. The apparatus of claim 1, wherein one or more dimensions associated with the conductive member and one or more dimensions associated with the non-conductive member correspond to one or more dimensions associated with one or more fuse holders of an industrial fuse block.

8. The apparatus of claim 7, wherein the one or more dimensions associated with the conductive member and the one or more dimensions associated with the non-conductive member correspond to one or more dimensions associated with distal ends of a power distribution fuse.

9. The apparatus of claim 8, wherein the power distribution fuse comprises a cartridge fuse.

10. The apparatus of claim 8, wherein the power distribution fuse comprises a fuse type of Underwriters Laboratories (UL) Class CC, UL Class CD, UL Class J, UL Class UL Class R, UL Class G, or UL Class T.

11. A method comprising:
    receiving, from a first power source, power via a conductive base comprising a first attachment element configured to receive the power from the first power source via a direct post connector and a second attachment element configured to receive the power from the first power source via a banana jack, wherein the first attachment element is configured to extend from a side of the conductive base and the second attachment element is configured to extend from a side of the first attachment element opposite of the conductive base;
    transferring, via a conductive member extending from a side of the conductive base perpendicular from the first attachment element, the power to a load; and
    preventing, via a non-conductive member extending from an opposite side of the conductive base from the conductive member, at least a portion of the power from backfeeding to one or more of a second power source or a device.

12. The method of claim 11, wherein the conductive base and the conductive member each comprise one or more of silver, copper, or gold.

13. The method of claim 11, wherein the non-conductive member comprises a fiberglass-epoxy laminate.

14. The method claim 1, wherein the load comprises one or more of power consuming components or devices of a power generation system.

15. The method of claim 11, wherein the first power source comprises a power distribution device.

16. The method of claim 11, wherein the power comprises AC power or DC power.

17. The method of claim 11, wherein one or more dimensions associated with the conductive member and one or more dimensions associated with the non-conductive member correspond to one or more dimensions associated with one or more fuse holders of an industrial fuse block.

18. The method of claim 17, wherein the one or more dimensions associated with the conductive member and the one or more dimensions associated with the non-conductive member correspond to one or more dimensions associated with distal ends of a power distribution fuse.

19. The method of claim 18, wherein the power distribution fuse comprises a cartridge fuse.

20. The method of claim 18, wherein the power distribution fuse comprises a fuse type of Underwriters Laboratories (UL) Class CC, UL Class CD, UL Class J, UL Class UL Class R, UL Class G, or UL Class T.

* * * * *